(12) United States Patent
Iida et al.

(10) Patent No.: US 11,114,600 B2
(45) Date of Patent: Sep. 7, 2021

(54) POLYCRYSTALLINE MAGNESIUM SILICIDE AND USE THEREOF

(71) Applicant: Tokyo University of Science Foundation, Tokyo (JP)

(72) Inventors: Tsutomu Iida, Tokyo (JP); Syunsuke Kondo, Tokyo (JP); Mitsunobu Nakatani, Tokyo (JP)

(73) Assignee: Tokyo University of Science Foundation, Tokyo (JP)

( * ) Notice: Subject to any disclaimer, the term of this patent is extended or adjusted under 35 U.S.C. 154(b) by 0 days.

(21) Appl. No.: 16/314,841

(22) PCT Filed: Jul. 5, 2017

(86) PCT No.: PCT/JP2017/024671
§ 371 (c)(1),
(2) Date: Jan. 2, 2019

(87) PCT Pub. No.: WO2018/012369
PCT Pub. Date: Jan. 18, 2018

(65) Prior Publication Data
US 2019/0245129 A1 Aug. 8, 2019

(30) Foreign Application Priority Data

Jul. 12, 2016 (JP) .............................. JP2016-137976

(51) Int. Cl.
*H01L 35/14* (2006.01)
*B22F 3/10* (2006.01)
(Continued)

(52) U.S. Cl.
CPC ............... *H01L 35/14* (2013.01); *B22F 3/10* (2013.01); *C01B 33/06* (2013.01); *C04B 35/58* (2013.01);
(Continued)

(58) Field of Classification Search
CPC ......... H01L 35/14; H01L 35/22; H01L 35/34; H01L 35/28; H01L 35/26; C22C 1/02;
(Continued)

(56) References Cited

U.S. PATENT DOCUMENTS

2005/0241689 A1* 11/2005 Chen .................... H01L 35/18
136/201
2010/0051081 A1* 3/2010 Iida .................... C04B 35/6265
136/240

(Continued)

FOREIGN PATENT DOCUMENTS

JP 2002285274 A * 10/2002
JP 2005-183528 A 7/2005

(Continued)

OTHER PUBLICATIONS

Matsuno ("The effects of sintering conditions and fullerene addition on the thermoelectric characteristics of Mg2Si"), Abstracts of the Japan Institute of Metals, p. 463, Sep. 23, 2008 (Year: 2008).*
English machine translation of JP 2002-285274 A (Year: 2020).*
International Search Report dated Sep. 26, 2017 in International Application No. PCT/JP2017/024671.

(Continued)

*Primary Examiner* — Angelo Trivisonno
(74) *Attorney, Agent, or Firm* — Knobbe Martens Olson & Bear LLP

(57) ABSTRACT

Polycrystalline magnesium silicide containing only carbon as a dopant and having carbon distributed at the crystal grain boundaries and within the crystal grains, a thermoelectric conversion material obtained using the polycrystalline magnesium silicide, a sintered compact, a thermoelectric conversion element, and a thermoelectric conversion module, and methods for producing polycrystalline magnesium silicide and a sintered compact.

18 Claims, 14 Drawing Sheets

(51) Int. Cl.
- *C01B 33/06* (2006.01)
- *C04B 35/58* (2006.01)
- *C22C 23/00* (2006.01)
- *C22C 1/04* (2006.01)
- *C22C 1/02* (2006.01)
- *H01L 35/22* (2006.01)
- *H01L 35/26* (2006.01)
- *H01L 35/28* (2006.01)
- *H01L 35/34* (2006.01)

(52) U.S. Cl.
CPC .................. *C22C 1/02* (2013.01); *C22C 1/04* (2013.01); *C22C 23/00* (2013.01); *H01L 35/22* (2013.01); *H01L 35/26* (2013.01); *H01L 35/28* (2013.01); *H01L 35/34* (2013.01); *B22F 2302/45* (2013.01)

(58) Field of Classification Search
CPC ........... C22C 1/04; C22C 23/00; C04B 35/58; C01B 33/06; B22F 3/10; B22F 2302/45
See application file for complete search history.

(56) References Cited

U.S. PATENT DOCUMENTS

2012/0097205 A1   4/2012  Iida et al.
2014/0360546 A1*  12/2014 Reifenberg ............. H01L 35/22
                                                          136/201

FOREIGN PATENT DOCUMENTS

| JP | 2011-029632 A | 2/2011 |
| JP | 2012-190984 A | 10/2012 |
| JP | 576776 B2 | 8/2015 |
| JP | 2017-108093 A | 6/2017 |

OTHER PUBLICATIONS

Matsuno et al., "Effects of Sintering Conditions and Fullerene Addition on Thermoelectric Properties of Mg$_2$Si," *Abstracts of the Japan Institute of Metals*, Sep. 23, 2008, p. 463.

Extended European Search Report issued in European Patent Application No. EP17827497.3, dated May 24, 2019.

* cited by examiner

FIG. 5

| IMPURITY CONCENTRATION | C(fullerene) 0.5 at% | C(fullerene) 1.0 at% |
|---|---|---|
| APPEARANCE PHOTOGRAPH | | |
| OPTICAL MICROSCOPE PHOTOGRAPH | 100 μm | 100 μm |
| RELATIVE DENSITY | 98.6% | 98.8% |

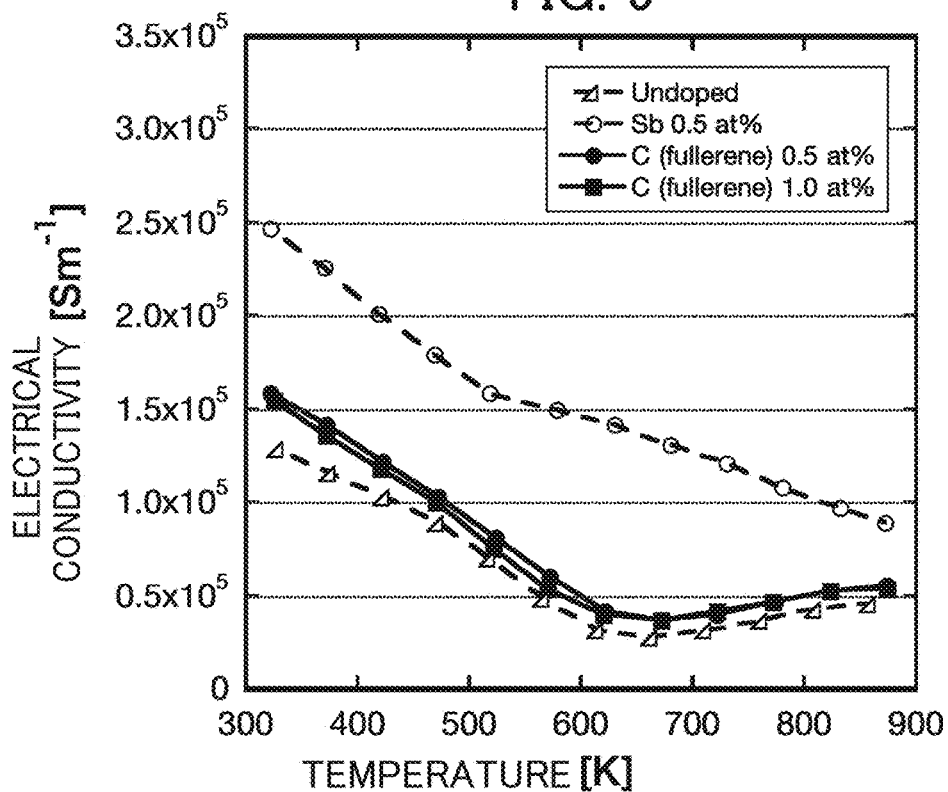
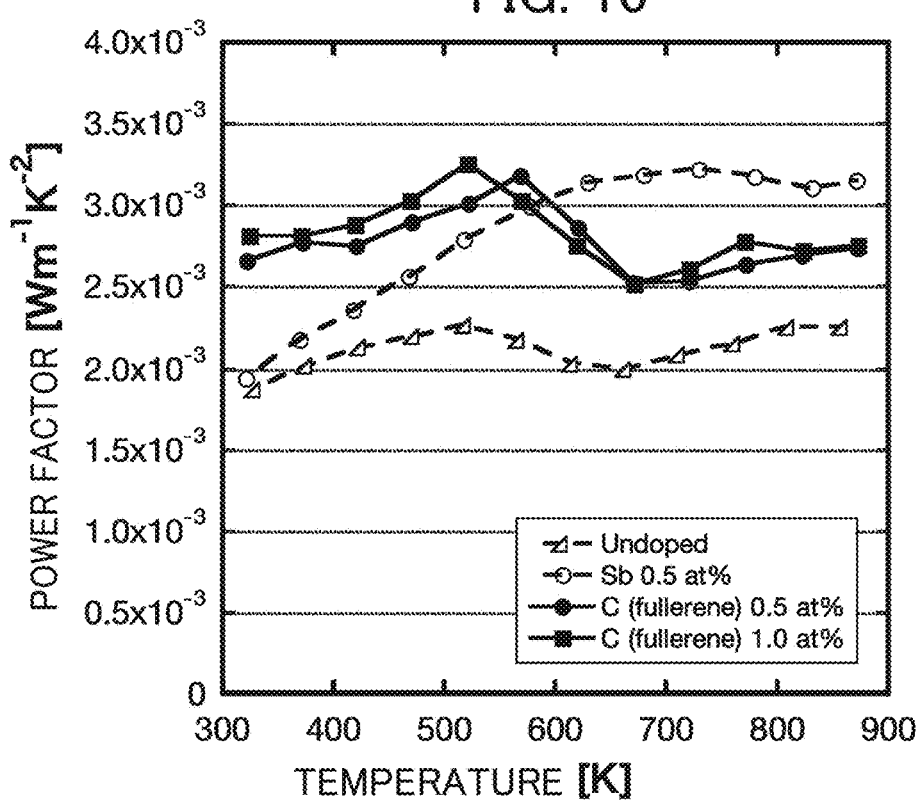

POLYCRYSTALLINE MAGNESIUM SILICIDE AND USE THEREOF

This application is the U.S. National Phase under 35 U.S.C. § 371 of International Application PCT/JP2017/024671, filed Jul. 5, 2017, designating the U.S., and published in Japanese as WO 2018/112369 on Jan. 18, 2018, which claims priority to Japanese Patent Application No. 2016-137976, filed Jul. 12, 2016, the entire contents of which are incorporated herein by reference.

TECHNICAL FIELD

The present invention relates to polycrystalline magnesium silicide, a thermoelectric conversion material, a sintered body, a thermoelectric conversion element, a thermoelectric conversion module, a method for producing polycrystalline magnesium silicide, and a method for producing a sintered body.

BACKGROUND ART

In recent years, various means of efficiently using a variety of energies have been considered in response to the heightening environmental problems. In particular, accompanying an increase in industrial waste and the like, the effective utilization of waste heat generated during the incineration of these wastes has become an issue. For example, in a large-scale waste incineration facility, waste heat recovery is performed by generating high pressure steam from the waste heat, and generating electricity by causing a steam turbine to rotate by way of this steam. However, in a mid-scale or small-scale waste incineration facility, which accounts for a great majority of waste incineration facilities, the amount of waste heat exhaust is small, and thus the recovery method for waste heat of generating electricity by way of a steam turbine or the like has not been able to be employed.

As an electricity generation method using waste heat that can be employed in such a mid-scale or small-scale waste incineration facility, for example, methods using thermoelectric conversion materials, thermoelectric conversion elements, or thermoelectric conversion modules for reversibly performing thermoelectric conversion by utilizing the Seebeck effect or the Peltier effect have been proposed. The thermoelectric conversion element includes a thermoelectric conversion part using a thermoelectric conversion material and an electrode part, and the thermoelectric conversion module is configured by attaching a plurality of thermoelectric conversion elements.

In the related art, many thermoelectric conversion materials have been proposed; in particular, magnesium silicide is attracting attention in view of the magnesium silicide having excellent thermoelectric conversion performance in a high-temperature range and in view of both of magnesium and silicon, which are raw materials, abundantly existing as resources and having no toxicity (for example, see Patent Document 1).

For example, a magnesium silicide powder containing at least one element selected from Sn and Ge and at least one element selected from Al, Ag, As, Cu, Sb, P, and B as a dopant has been known (for example, see Patent Document 2).

Further, a $Mg_2Si_{1-x}Sn_x \cdot Aa \cdot Bb$ polycrystalline body has been known in which an element of a transition metal B and/or silicide of the transition metal B is dispersed in $Mg_2Si_{1-x}Sn_x$ doped with at least one kind of dopant A selected from Sb, P, As, Bi, and Al (for example, see Patent Document 3).

Patent Document 1: Japanese Unexamined Patent Application, Publication No. 2011-29632
Patent Document 2: Japanese Unexamined Patent Application, Publication No. 2012-190984
Patent Document 3: Japanese Patent No. 5765776

DISCLOSURE OF THE INVENTION

Problems to be Solved by the Invention

Among the magnesium silicides added with various kinds of dopants as described in Patent Documents 1 to 3, magnesium silicide using only antimony and not using a dopant other than antimony (also referred to as magnesium silicide added with only antimony) is known as a thermoelectric conversion material which is most excellent currently in view of thermoelectric conversion performance in a high-temperature range (about 600 K to 900 K) and high-temperature durability.

The magnesium silicide added with antimony is formed, for example, by the method described in Patent Document 1 in such a manner that a raw material mixture of magnesium, silicon, and antimony is melted and synthesized to produce ingot and the ingot is pulverized and then sintered. However, the magnesium silicide added with antimony has problems in practical use such as poor productivity because of its extremely low sinterability of about 20% and toxicity of antimony.

Further, in recent years, the demand for the thermoelectric conversion element in a low-middle temperature range is increasing, and for example, efficient conversion of waste heat of automobiles and the like into power has been studied. In this regard, also regarding magnesium silicide, development of magnesium silicide having practically excellent thermoelectric conversion performance in a low-middle temperature range has been expected.

Further, many of dopants including antimony which are conventionally used in magnesium silicide are n-type impurities so that carriers are released and currents are output much, and as a result, electrical conductivity is enhanced to increase a current value, and in the case of using such a magnesium silicide as a power generation element, many elements are necessary in order to compensate necessary power. Therefore, it is considered that the loss rate of generated power increases and many thermoelectric conversion elements corresponding to the increased loss are necessary, but reports or proposals dealing with those problems are not present in the related arts.

Further, the above-described problems which may occur in the case of using n-type impurities will be described. In general, a figure-of-merit parameter (Z) is mentioned as an evaluation index for comparing the performance of the thermoelectric conversion material; however, the performance of the thermoelectric conversion material depends on an operating temperature, and thus as another evaluation index, a dimensionless figure-of-merit parameter ZT obtained by the following Equation (1), that is, a product of the figure-of-merit parameter (Z) and an operating temperature (T) is mentioned.

$$ZT = \frac{S^2 \sigma}{\kappa} T \qquad (1)$$

In Equation (1), S represents a Seebeck coefficient, σ represents electrical conductivity, T represents an operating temperature (absolute temperature), and κ represents thermal conductivity. Further, $S^2\sigma$ that is a product of the square of the Seebeck coefficient S and the electrical conductivity σ is called a power factor, this power factor is an index for a power amount which can be extracted when a temperature difference is provided to a thermoelectric conversion element produced using magnesium silicide, and as a numerical value of the power factor increases, an output density also increases. Further, the thermal conductivity κ corresponds to a sum of carrier thermal conductivity and lattice thermal conductivity.

In order to enhance the performance of the thermoelectric conversion material, as clearly understood from the above-described Equation (1), it is generally considered that a higher Seebeck coefficient S, a higher electrical conductivity σ, and a lower thermal conductivity κ, that is, a higher power factor $S^2\sigma$ and a lower thermal conductivity κ are obtained.

That is, studies and development of the thermoelectric conversion material and the like of the related art aim to increase the dimensionless figure-of-merit parameter ZT in such a manner that the power factor is improved by enhancing the electrical conductivity of the above-described Equation (1) using n-type impurities as the dopant, and at the same time, the thermal conductivity of the denominator is decreased. In particular, it is a current situation that, focusing on enhancing of the electrical conductivity, n-type impurities have been used as the dopant and selection of n-type impurities or a combination thereof has been studied.

However, there is limitation on selection of n-type impurities or a combination thereof, and the n-type impurities release carriers, so that, if the carrier concentration changes, this change affects all of the Seebeck coefficient, the electrical conductivity, the carrier thermal conductivity, and the lattice thermal conductivity among the variables of the above-described Equation (1), and then they change. Therefore, it is difficult to optimize the carrier concentration by adjusting the concentration of the n-type impurities and to control the thermoelectric conversion performance.

The present invention has been made in view of various problems described above and made in view of the following items 1), 2), and 3) being regarded as problems to be solved, and has been aimed to create more excellent polycrystalline magnesium silicide to be used instead of conventional magnesium silicide added with only antimony:
1) to provide polycrystalline magnesium silicide with less toxicity and high sinterability, a thermoelectric conversion material and a sintered body which are obtained by using the polycrystalline magnesium silicide, and methods for producing the polycrystalline magnesium silicide and the sintered body;
2) to provide a thermoelectric conversion element using the polycrystalline magnesium silicide and having excellent high-temperature durability and excellent thermoelectric conversion performance in a low-middle temperature range; and
3) to provide a thermoelectric conversion module using the polycrystalline magnesium silicide and being capable of suppressing power loss to occur and decreasing the number of thermoelectric conversion elements.

Means for Solving the Problems

The present inventors have focused on isoelectronic impurities of silicon as a dopant used in polycrystalline magnesium silicide in order to solve the above-described problems, and have conducted intensive studies.

First, the present inventors have studied polycrystalline magnesium silicide using germanium or tin that is isoelectronic impurities, and as a result, in a temperature range of 400 K to 900 K that is necessary for practical use, the former has problems of deliquescence and oxidation degradation and the latter has a problem of oxidation degradation. Further, in both cases, high-temperature durability is low. Next, the present inventors have studied various carbon allotropes and found that graphite is difficult to dissolve in polycrystalline magnesium silicide because of its strong bonding and a high melting point, and finally, the present inventors have confirmed that polycrystalline magnesium silicide produced by using fullerene as a carbon source does not have problems of deliquescence and oxidation degradation and is effective as a thermoelectric conversion material, thereby creating the present invention. The reason why different results are generated even in the same isoelectronic impurities is considered that both germanium and tin generate silicon and an alloy-based solid dispersion, but carbon is substituted with silicon or generates a compound.

Specific means for solving the problems of the present invention are as follows.

<1> Polycrystalline magnesium silicide containing only carbon as a dopant and having carbon distributed within crystal grains and at crystal grain boundaries.

<2> The polycrystalline magnesium silicide described in <1>, in which the polycrystalline magnesium silicide contains 0.05 at % to 3.0 at % of carbon.

<3> A thermoelectric conversion material composed of the polycrystalline magnesium silicide described in <1> or <2>.

<4> A sintered body being obtained by sintering the polycrystalline magnesium silicide described in <1> or <2>.

<5> The sintered body described in <4>, in which a power factor at 523 K is $3.0 \times 10^{-3}$ $Wm^{-1}K^{-2}$ or more, and a figure-of-merit parameter (Z) at 523 K is $0.78 \times 10^{-3}$ $K^{-1}$ or more.

<6> The sintered body described in <4> or <5>, in which a dimensionless figure-of-merit parameter (ZT) at 523 K is 0.40 or more, and a dimensionless figure-of-merit parameter (ZT) at 873 K is 0.86 or more.

<7> A thermoelectric conversion element including a thermoelectric conversion part composed of the sintered body described in any one of <4> to <6>; and a first electrode and a second electrode provided to the thermoelectric conversion part.

<8> A thermoelectric conversion module including the thermoelectric conversion element described in <7>.

<9> A method for producing the polycrystalline magnesium silicide described in <1> or <2>, the method including:
a step of heating and melting a starting material composition obtained by mixing magnesium, silicon, and a carbon source to produce a melted and solidified material.

<10> The method described in <9>, in which the carbon source is a carbon allotrope formed by carbon having $sp^2$ hybrid orbital and carbon having $sp^3$ hybrid orbital.

<11> The method described in <9> or <10>, in which the carbon source is fullerene.

<12> The method described in any one of <9> to <11>, further including a step of pulverizing the melted and solidified material to produce a pulverized material.

<13> A method for producing a sintered body, the method including a step of sintering a pulverized material obtained by the method described in <12>.

Effects of the Invention

According to the present invention, it is possible to provide polycrystalline magnesium silicide with less toxicity and high sinterability in which carbon that is isoelectronic impurities of silicon is distributed within crystal grains and at crystal grain boundaries, a thermoelectric conversion material and a sintered body which are obtained by using the polycrystalline magnesium silicide, and methods for producing the polycrystalline magnesium silicide and the sintered body. Further, according to the present invention, by using the polycrystalline magnesium silicide, it is possible to provide a thermoelectric conversion element having excellent high-temperature durability and excellent thermoelectric conversion performance in a low-middle temperature range and to provide a thermoelectric conversion module being capable of suppressing power loss to occur and decreasing the number of thermoelectric conversion elements.

BRIEF DESCRIPTION OF THE DRAWINGS

FIG. 5 shows appearance photographs and optical microscope photographs of polycrystalline magnesium silicide sintered bodies in Example 1 and Example 2.

FIG. 9 is a graph showing a relation between a temperature and electrical conductivity of the polycrystalline magnesium silicide sintered bodies in Examples 1 and 2 and Comparative Examples 1 and 2.

FIG. 10 is a graph showing a relation between a temperature and a power factor of the polycrystalline magnesium silicide sintered bodies in Examples 1 and 2 and Comparative Examples 1 and 2.

PREFERRED MODE FOR CARRYING OUT THE INVENTION

Figure 1:
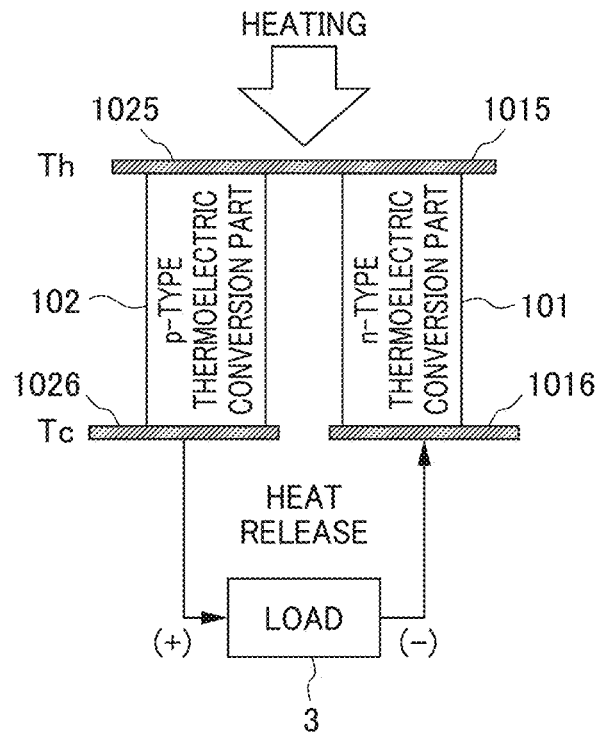
FIG. 1 is a view showing an example of a thermoelectric conversion module.

In this specification, the numerical range expressed using "to" means a range including numerical values described before and after "to" as a lower limit and an upper limit.

Outline of Polycrystalline Magnesium Silicide

Regarding the polycrystalline magnesium silicide of present disclosure, it is considered that carbon thereof is distributed within crystal grains and is also distributed at crystal grain boundaries, but carbon distributed within crystal grains mainly functions effectively to thermoelectric conversion performance. Further, it is speculated that carbon distributed at crystal grain boundaries contributes to enhancement of sinterability. It should be noted that carbon dissolved in crystals or substituted with Si is regarded to be distributed within grains in this disclosure.

A novel polycrystalline magnesium silicide in this technical field in which carbon that is isoelectronic impurities of silicon is distributed within crystal grains, and a thermoelectric conversion element or thermoelectric conversion module using the same have superior performance and characteristics described in the following (1) to (4) as compared to polycrystalline magnesium silicide added with only antimony as a dopant which has been considered to be most excellent in the related art:

(1) having less toxicity, high sinterability of a yield of about 95% or more, and excellent high-temperature durability;

(2) being capable of suppressing power loss occurring in the case of modularization using polycrystalline magnesium silicide and decreasing the number of thermoelectric conversion elements;

(3) having a high power factor that is practically effective in a low-middle temperature range, and having the same or higher dimensionless figure-of-merit parameter in a high-temperature range; and (4) in addition thereto, having a high dimensionless figure-of-merit parameter in all temperature ranges as compared to the case of not containing a dopant at all (also referred to as undoped one).

It should be noted that the polycrystalline magnesium silicide in present disclosure is in a context which includes a melted and solidified material of a starting material composition containing magnesium, silicon, and a carbon source and a pulverized material (powder) of the melted and solidified matetial.

Point of View about Performance of Thermoelectric Conversion Material

Since the polycrystalline magnesium silicide of present disclosure uses only isoelectronic impurities not releasing carrier as a dopant, even when the amount of the dopant is changed, values of the respective Seebeck coefficient, electrical conductivity, and carrier thermal conductivity are almost not changed but are almost the same as those in the case of undoped one. For this reason, when the thermoelectric conversion performance is adjusted, for example, only the lattice thermal conductivity may be controlled as low as possible, and there is an advantage that the adjustment of thermoelectric conversion performance is extremely easy.

That is, since the polycrystalline magnesium silicide of present disclosure uses only isoelectronic impurities not releasing carrier as a dopant, as compared to undoped one, the numerator component and the denominator component can be separately controlled, that is, only lattice thermal conductivity of the denominator in the above-described Equation (1) is decreased and a dimensionless figure-of-merit parameter ZT is increased while the power factor of the numerator in the above-described Equation (1) is not changed. The polycrystalline magnesium silicide of present disclosure is made based on such a new point of view.

In the present specification, as described above, one, which uses conventional polycrystalline magnesium silicide containing n-type impurities as a dopant and outputs increased electrical conductivity and decreased thermal conductivity by carriers to be released, is referred to as a "current output type". Meanwhile, one, which changes only lattice thermal conductivity by using polycrystalline magnesium silicide containing isoelectronic impurities, secures a high electromotive voltage at that time while suppressing electrical conductivity at the same level as in undoped one, suppresses generated power loss by suppressing a current value in the case of modularization, and as a result, can decrease the number of thermoelectric conversion elements, is referred to as a "voltage output type".

In present disclosure, a thermoelectric conversion element and a thermoelectric conversion module which use polycrystalline magnesium silicide containing carbon and not containing a dopant other than carbon correspond to the "voltage output type".

Power Factor as Evaluation Index for Thermoelectric Conversion Performance

The thermoelectric conversion performance of the thermoelectric conversion material is generally evaluated by the dimensionless figure-of-merit parameter ZT, but as described below, the power factor is considered to be important as an evaluation index in present disclosure. As understood from the above-described Equation (1), since ZT largely depends on the power factor and the thermal conductivity, it is necessary to review which one of the power factor and the thermal conductivity largely contributes to ZT. In industrial furnaces and the like that continuously output a constant quantity of heat, in order to provide a temperature difference to the thermoelectric conversion element, it is necessary to preferentially consider that the thermal conductivity is low. On the other hand, in the case of automobiles and the like that generate heat instantaneously at the time of braking or accelerating, in order to extract instantaneously generated heat without waste, the value of the power factor needs to be high in addition to the thermal conductivity being low, and as the value of the power factor is higher, a larger amount of power is extracted. Therefore, the fact that the thermoelectric conversion element of present disclosure using magnesium silicide has a high power factor in a low-middle temperature range indicates that the thermoelectric conversion element of present disclosure is extremely effective for automobiles in particular whose exothermic temperature is in a middle temperature range.

Behavior of Carbon as Isoelectronic Impurities

In a case where the Seebeck coefficient, the electrical conductivity, and the carrier thermal conductivity of a plurality of polycrystalline magnesium silicides in which the amount of fullerene as a carbon source is changed and undoped polycrystalline magnesium silicide non containing a dopant are measured while a temperature is changed, almost the same values are obtained in both cases.

However, the lattice thermal conductivity is different between the plurality of polycrystalline magnesium silicide in which the amount of fullerene is changed, and those values are significantly lower than that in the undoped polycrystalline magnesium silicide. Further, when the plurality of polycrystalline magnesium silicide in which the amount of fullerene is changed is observed in detail, those values tend to be differentiated to each other in a range of about 300 K to about 600 K, and those values tend to be almost the same as the temperature increases from about 650 K.

These results show that carbon functions as isoelectronic impurities, and from this point, it is found that carbon is distributed within grains.

It should be noted that the reason why the value of lattice thermal conductivity decreases is considered that carbon having a different ionic radius from magnesium or silicon is distributed within grains so that lattice is distorted and phonon scattering is induced.

On the other hand, when measurement of polycrystalline magnesium silicide containing only antimony as a dopant is performed similarly, the Seebeck coefficient is changed to be a low value and the electrical conductivity is changed to be a high value with respect to undoped one. Further, both the carrier thermal conductivity and the lattice thermal conductivity are a low value with respect to undoped one. In this way, it is found that all values are different from those of undoped one, and antimony shows the behavior peculiar to n-type impurities. Therefore, the polycrystalline magnesium silicide of present disclosure acts as the voltage output type that is at a high voltage and a low current, and polycrystalline magnesium silicide containing n-type impurities but not containing carbon acts as the current output type that is at a low voltage and a high current since the electrical conductivity thereof is enhanced.

Effect of Suppressing Power Loss or the Like by Polycrystalline Magnesium Silicide of Present Disclosure When the thermoelectric conversion module is operated, in a case where a plurality of thermoelectric conversion elements, a DC/DC converter, and an external load circuit are connected, impedance matching is difficult to achieve and power loss occurs. Taking into consideration that the loss is expressed by a product of the square of the current value and the resistance value, the polycrystalline magnesium silicide of present disclosure of the voltage output type that is at a low current can further suppress a decrease in output due to the loss and more useful than polycrystalline magnesium silicide of the current output type that is at a high current.

Further, in a case where a plurality of thermoelectric conversion elements in which polycrystalline magnesium silicide is configured as a thermoelectric conversion part are connected in series, a current value is decreased by resistance in the thermoelectric conversion elements, and taking this into consideration that a current value is restricted by thermoelectric conversion elements having a small temperature difference, the voltage output type is more preferable than the current output type.

High-Temperature Durability

As shown in test results described later, the polycrystalline magnesium silicide added with carbon in present disclosure has superior high-temperature durability compared to polycrystalline magnesium silicide added with antimony and carbon does not toxicity unlike antimony so that there is almost no load to the environment. Further, even in the thermoelectric conversion element using the sintered body as the thermoelectric conversion part and provided with electrodes at the both end parts thereof, a thermoelectric conversion element using the polycrystalline magnesium silicide sintered body in which carbon is added to the thermoelectric conversion part has high durability without the electrodes being peeled off even at a high temperature for a long time of 2000 hours or longer, but in a thermoelectric conversion element using the polycrystalline magnesium silicide sintered body added with antimony, electrode parts are peeled off in a short time of 500 hours at most. Such polycrystalline magnesium silicide containing carbon has extremely preferable characteristics in practical use.

Sinterability

Further, since the polycrystalline magnesium silicide of present disclosure has high sinterability, a sintered body without cracks can be easily obtained. That is, by using the polycrystalline magnesium silicide of present disclosure, a sintered body having a high relative density can be obtained in high yield. In Examples described later, the yield of the sintered body is 100% and the relative density is 98% or more, that is, both the yield and the relative density are extremely high values. The reason for this is considered that carbon distributed at crystal grain boundaries exhibits a binder effect. Since the sintered body having a high relative density has almost no defects such as voids, the sintered body stably exhibits high thermoelectric conversion capacity as the thermoelectric conversion part of the thermoelectric conversion element and has a high physical strength, so that the sintered body is excellent in durability without being weathered and can be used as a thermoelectric conversion material excellent stability and reliability.

On the other hand, the polycrystalline magnesium silicide added with only antimony has a yield of the sintered body of about 20% and has low sinterability. Therefore, the polycrystalline magnesium silicide added with only antimony forms cracks and the like to cause oxidation degradation and to thereby degrade durability, so that the polycrystalline magnesium silicide added with only antimony is not suitable for practical use.

Carbon Source

In the polycrystalline magnesium silicide of present disclosure, although not particularly limited as long as carbon is distributed within crystal grains and at crystal grain boundaries, the total content of carbon distributed within crystal grains and at crystal grain boundaries in the polycrystalline magnesium silicide is preferably 0.05 at % to 3.0 at %, more preferably 0.1 at % to 2.0 at %, further preferably 0.5 at % to 1.5 at %, and particularly preferably 0.5 at % to 1.0 at %, in order to achieve desired effects such as thermoelectric conversion performance and sinterability. The total content of carbon means not only the amount of carbon contained in the polycrystalline magnesium silicide of present disclosure but also the amount of raw material charged at the time of production.

As the carbon source, from the viewpoint that the carbon source is easily dissolved in the polycrystalline magnesium silicide and carbon is distributed in a suitable way within crystal grains and at crystal grain boundaries, particularly within crystal grains in the heating and melting step, the melting point is preferably 1400 K to 1500 K and more preferably 1425 K to 1475 K.

Further, as the carbon source, it is preferable to use a carbon allotrope in which a carbon-carbon bond is easily broken, from the demands of being easily dissolved in polycrystalline magnesium silicide in the heating and melting step and distributing carbon in a suitable way within crystal grains and at crystal grain boundaries. In particular, fullerenes which have carbon having $sp^3$ hybrid orbital in which a carbon-carbon bond is easily broken is preferable, and one which contain both carbon having $sp^2$ hybrid orbital and carbon having $sp^3$ hybrid orbital is more preferable. The ratio of carbon having $sp^3$ hybrid orbital to the total of carbon having $sp^2$ hybrid orbital and carbon having $sp^3$ hybrid orbital is preferably 60% to 90% and more preferably 60% to 75%.

Further, examples of the carbon source include fullerene, diamond-like carbon (DLC), solid-state carbon as a DLC raw material, carbon nanotubes such as colossal carbon tubes and carbon nanohorns, graphenes such as nanographenes and graphene nanoribbons, and amorphous carbon, and fullerene is particularly preferable.

As the fullerene, fullerene C60 can be used, other than that, C70, C76, C78, C82, C84, C90, C94, C96, or the like may be used, and these fullerenes may be used alone or in combination thereof.

The fullerene may be an atom encapsulated fullerene (also referred to as a metal encapsulated fullerene). The atom encapsulated fullerene includes one or a plurality of atoms such as gadolinium (Gd), lanthanum (La), scandium (Sc), yttrium (Y), terbium (Tb), dysprosium (Dy), and erbium (Er) in the fullerene.

The mean particle size of fullerene is preferably 1 molecular diameter or more and 100 nm or less.

In the polycrystalline magnesium silicide of present disclosure, carbon distributed at crystal grain boundaries and carbon distributed within crystal grains can be confirmed, for example, by elemental analysis using an electron probe microanalyzer (EPMA).

In the polycrystalline magnesium silicide of present disclosure, the proportion of carbon distributed within crystal grains and the proportion of carbon distributed at crystal grain boundaries can be adjusted by the type and amount of carbon source added, heating and melting conditions described later, sintering conditions, and the like.

The polycrystalline magnesium silicide of present disclosure can be suitably used as a thermoelectric conversion material, and has characteristics such as high thermoelectric conversion performance, high durability, and a high physical strength, which are required when the polycrystalline magnesium silicide is put into practical use as a thermoelectric conversion element or a thermoelectric conversion module.

Method for Producing Polycrystalline Magnesium Silicide

In the polycrystalline magnesium silicide of present disclosure, the ratio of the content of Mg to the content of Si is approximately 2:1 in terms of atomic weight ratio, and the ratio of the content of Mg to the content of Si is preferably 66.17:33.83 to 66.77:33.23 and more preferably 66.27:33.73 to 66.67:33.33 in terms of atomic weight ratio. Further, the atomic weight ratio of the carbon source as a dopant is, as described above, preferably 0.05 at % to 3.0 at %, more preferably 0.1 at % to 2.0 at %, further preferably 0.5 at % to 1.5 at %, and particularly preferably 0.5 at % to 1.0 at %. The polycrystalline magnesium silicide of present disclosure is produced by the production method including a step of heating and melting a starting material composition containing Mg, Si, and a carbon source in a heat-insulated container to produce a melted and solidified material.

As Si as a raw material, for example, high-purity silicon can be used. Herein, high-purity silicon having a purity of 99.9999% or more is preferred, and examples thereof include high-purity silicon used in the production of silicon goods such as semiconductors and photovoltaic cells. It should be noted that Mg as a raw material is not particularly limited, but may be high-purity Mg (for example, a purity of 99% or more) or a Mg alloy.

The method for producing polycrystalline magnesium silicide preferably includes a mixing step of mixing Mg, Si, and a carbon source to obtain a starting material composition and a heating and melting step of heating and melting the starting material composition to produce a melted and solidified material. In the heating and melting step, almost the whole starting material composition is heated and melted to synthesize polycrystalline magnesium silicide. Further, the method for producing polycrystalline magnesium silicide may further include a pulverizing step of pulverizing the melted and solidified material to produce a pulverized material. The melted and solidified material and the pulverized material obtained in each of those steps each independently have a commodity value.

Mixing Step

In the mixing step, Mg, Si, and a carbon source are mixed to obtain a starting material composition.

Heating and Melting Step

In the heating and melting step, it is preferable to heat treat the starting material composition obtained in the mixing step under a reducing atmosphere and preferably under reduced pressure, under temperature conditions exceeding the melting point of Mg and falling below the melting point of Si, to fuse synthesize polycrystalline magnesium silicide. Herein, "under a reducing atmosphere" indicates an atmosphere particularly containing 5% by volume or more of hydrogen gas, and containing inert gas(es) as the other component(s) as necessary. By performing the heating and melting step under such a reducing atmosphere in combination with the following various conditions, magnesium and silicon can be reliably made to react, and thus polycrystalline magnesium silicide of present disclosure produced by synthesis does not contain unreacted magnesium and unreacted silicon. When those unreacted products remain, magnesium oxide and silicon oxide are generated in the subsequent step, and in particular, the magnesium oxide causes chaps and the like to decrease physical strength such as heat resistance or durability, which is not appropriate in practical use.

As the pressure condition in the heating and melting step, although it may also be at atmospheric pressure, $1.33 \times 10^{-3}$ Pa to atmospheric pressure is preferable, and if taking safety into consideration, it is preferably performed at reduced pressure conditions on the order of 0.08 MPa or vacuum conditions, for example. In addition, as the heating conditions in the heating and melting step, it is preferable to conduct heat treatment, for example, for about 3 hours at 700° C. or higher and lower than 1410° C., preferably at 1085° C. or higher and lower than 1410° C. Herein, the time of heat treatment may be 2 hours to 10 hours, for example. By conducting the heat treatment for a long time, it is possible to further homogenize polycrystalline magnesium silicide to be obtained. It should be noted that the melting point of $Mg_2Si$ (without a dopant) is 1085° C. and the melting point of silicon is 1410° C.

Herein, in a case where Mg is melted by heating a starting material composition to 693° C. or higher, which is the melting point of Mg, although Si will start to react by melting thereinto, the reaction rate will be somewhat slow. On the other hand, in a case where the starting material composition is heated to 1090° C. or higher, which is the boiling point of Mg, although the reaction rate will be high, Mg will suddenly vaporize and may disperse; therefore, it is necessary to synthesize with caution.

In the heating and melting step, temperature control of temperature rise and temperature decline upon heat treating the starting material composition is extremely important in order to obtain a desired melted and solidified material. As the temperature rise condition upon heat treating the starting material composition, for example, a temperature rise condition of 150° C./h to 250° C./h until reaching 150° C. and a temperature rise condition of 350° C./h to 450° C./h until reaching 1100° C. (or 1105° C.) can be exemplified. In addition, as a temperature decline condition after heat treatment, a temperature decline condition of 80° C./h to 150° C./h until reaching 900° C. and a temperature decline condition of 900° C./h to 1000° C./h thereafter can be exemplified. The temperature control at the time of temperature decline is performed such that the starting material composition is put into a crucible and heated and melted, a heated and melted material is synthesized, and then the heated and melted material is gradually cooled with a temperature gradient from the lower part to the upper part of the crucible. In this way, when gradual cooling is performed with a temperature gradient from the lower part to the upper part of the crucible, since aluminum oxide or residual silicon that is impurities derived from the process is gathered at the upper part, the upper part is removed by polishing or the like, and thus the intermediate part and the lower part can be used as high-purity polycrystalline magnesium silicide.

It should be noted that, when performing the heating and melting step, it is preferable that the heating and melting step is performed inside of a heat-insulated container including an opening portion and a lid portion covering this opening portion, and in which the contacting surface of the edge of the opening portion to the lid portion, and the contacting surface of the lid portion to the opening portion have both undergone polishing processing. By using the heat-insulated container undergoing polishing processing, it is thereby possible to easily obtain polycrystalline magnesium silicide having component proportions close to the component proportions of the starting material composition. This is considered to be due to gaps not forming at the contacting surface between the lid portion and the edge of the opening portion, and the heat-insulated container being sealed; therefore, the dispersion of vaporized Mg to outside the heat-insulated container can be suppressed.

As the heat-insulated container, a sealed container can be exemplified that is composed of any of alumina, magnesia, zirconia, platinum, iridium, silicon carbide, boron nitride, pyrolytic boron nitride, pyrolytic graphite, pyrolytic boron nitride coat, pyrolytic graphite coat, and quartz. In addition, as the dimensions of the above-mentioned heat-insulated container, a container can be exemplified in which the vessel main body is 12 mm to 300 mm in inside diameter, 15 mm to 320 mm in outside diameter, 50 mm to 250 mm in height, and the diameter of the lid portion is 15 mm to 320 mm.

Furthermore, in order to closely contact the contacting surface of the edge of the opening portion to the lid portion and the contacting surface of the lid portion to the opening portion, a surface waviness Rmax of the contacting surface is preferably 0.5 µm to 3 µm and more preferably 0.5 µm to 1 µm. In a case where the surface waviness Rmax is less than 0.5 µm, polishing is performed excessively, which is not preferable in terms of cost. Further, the top surface of the lid portion may be pressurized directly or indirectly by weight as necessary. The pressure during this pressurization is preferably 1 kg/cm² to 10 kg/cm².

As the gas used in order to perform the heating and melting step under a reducing atmosphere, although it may be 100% by volume hydrogen gas, a mixed gas of hydrogen gas and inert gas such as nitrogen gas or argon gas containing 5% by volume or more of hydrogen gas can be exemplified. The reason for performing the heating and melting step under a reducing atmosphere in this way can be given that, upon producing the polycrystalline magnesium silicide of present disclosure, as described above, there is a necessity to avoid as much as possible not only the generation of silicon oxide, but also magnesium oxide.

Pulverizing Step

The pulverizing step is a step of pulverizing the above-mentioned melted and solidified material that has been cooled to obtain a pulverized material. In the pulverizing step, the melted and solidified compound is preferably pulverized into fine particles having a narrow particle size distribution. By pulverizing into fine particles having a narrow particle size distribution, pulverized particles fuse at least at a portion of the surfaces thereof upon sintering this, and thus it is possible to sinter to an extent at which the occurrence of gaps (voids) are almost not observed, and a sintered body having a relative density of 98% or more can be obtained.

As the pulverized material obtained in this way, a material having a mean particle size of 0.1 µm to 100 µm, preferably 25 µm to 75 µm, and more preferably 0.1 µm to 0.2 µm can be used.

Sintered Body

The sintered body of present disclosure is obtained by sintering the polycrystalline magnesium silicide of present disclosure. As described above, since the polycrystalline magnesium silicide of present disclosure has high sinterability, it is possible to easily obtain a sintered body without cracks. That is, by using the polycrystalline magnesium silicide of present disclosure, it is possible to obtain a sintered body having a high relative density in high yield.

The preferable performance of the sintered body of present disclosure will be described below.

Regarding the Seebeck coefficient, the absolute value at 523 K is preferably 170 $\mu VK^{-1}$ or more and more preferably 210 $\mu VK^{-1}$ or more. Further, the absolute value of the Seebeck coefficient at 873 K is preferably 210 $\mu VK^{-1}$ or more and more preferably 230 $\mu VK^{-1}$ or more.

The electrical conductivity at 523 K is preferably $1.0 \times 10^5$ $Sm^{-1}$ or less and more preferably $0.8 \times 10^5$ $Sm^{-1}$ or less. Further, the electrical conductivity at 873 K is preferably $0.7 \times 10^5$ $Sm^{-1}$ or less and more preferably $0.5 \times 10^5$ $Sm^{-1}$ or less.

The power factor at 523 K is preferably $3.0 \times 10^{-3}$ $Wm^{-1}K^{-2}$ or more and more preferably $3.3 \times 10^{-3}$ $Wm^{-2}$ or more. Further, the power factor at 873 K is preferably $2.6 \times 10^{-3}$ $Wm^{-1}K^{-2}$ or more and more preferably $2.8 \times 10^{-3}$ $Wm^{-1}K^{-2}$ or more. Furthermore, the power factor at 327 K to 600 K is preferably $2.5 \times 10^{-3}$ $Wm^{-1}K^{-2}$ or more, more preferably $2.8 \times 10^{-3}$ $Wm^{-1}K^{-2}$ or more, and further preferably $3.5 \times 10^{-3}$ $Wm^{-1}K^{-2}$ or more. The sintered body having such a power factor has particularly excellent thermoelectric conversion performance in a middle temperature range, which is preferable.

Further, regarding the thermal conductivity, the thermal conductivity at 523 K is preferably 4.5 $Wm^{-1}K^{-1}$ or less, more preferably 3.0 $Wm^{-1}K^{-1}$ to 4.0 $Wm^{-1}K^{-1}$, and further preferably 3.0 $Wm^{-1}K^{-1}$ to 3.6 $Wm^{-1}K^{-1}$. Further, the thermal conductivity at 873 K is preferably 2.9 $Wm^{-1}K^{-1}$ or less.

Further, the dimensionless figure-of-merit parameter ZT at 523 K is preferably 0.40 or more and more preferably 0.45 or more. Further, the dimensionless figure-of-merit parameter ZT at 873 K is preferably 0.86 or more and more preferably 0.90 or more.

Further, the figure-of-merit parameter Z at 523 K is preferably $0.78 \times 10^{-3}$ $K^{-1}$ or more and more preferably $0.90 \times 10^{-3}$ $K^{-1}$ or more. Further, the figure-of-merit parameter Z at 873 K is preferably $0.98 \times 10^{-3}$ $K^{-1}$ or more and more preferably $1.20 \times 10^{-3}$ $K^{-1}$ or more.

As a preferable example of the sintered body of present disclosure, a sintered body having a power factor at 523 K of $3.0 \times 10^{-3}$ $Wm^{-1}K^{-2}$ or more and a figure-of-merit parameter Z at 523 K of $0.78 \times 10^{-3}$ $K^{-1}$ or more is exemplified. Further, as another preferable example of the sintered body of present disclosure, a sintered body having a dimensionless figure-of-merit parameter ZT at 523 K of 0.40 or more and a dimensionless figure-of-merit parameter ZT at 873 K of 0.86 or more is exemplified.

Method for Producing Sintered Body

The method for producing a sintered body of present disclosure includes a step of sintering a pulverized material obtained by pulverizing the melted and solidified material (sintering step).

Figure 24:
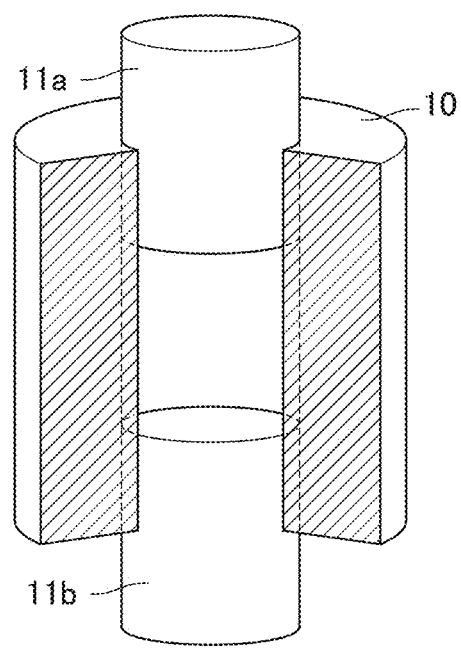
FIG. 24 is a view showing an example of a sintering device.

The shape of the sintered body is not limited, and a column shape or a prism shape may be applicable; however, in the case of using the tool as shown in FIG. 24, the sintered body is a circular cylinder, the pulverized polycrystalline magnesium silicide powder is filled in a space enclosed by a graphite die 10 and punches 11a and 11b made of graphite, and then sintering is performed using a spark plasma sintering apparatus. As the size of the circular cylinder, particularly, the hole diameter is larger, the thermoelectric conversion element can be cut out more, which is preferable; however, according to a desired size, the sintered body is produced in such a manner that the inside diameter of the graphite die 10 is set to about 10 mm to 50 mm and the height of the pulverized material to be filled in the punches 11a and 11b made of graphite is set to about 5 mm to 15 mm. As the sintering conditions in the sintering step, a method of sintering a pulverized material, for example, in a sintering tool made of graphite, by a pressurized compression sintering method under a vacuum or reduced atmosphere at a sintering pressure 5 MPa to 60 MPa and at a sintering temperature 600° C. to 1000° C. can be exemplified.

In the case of the sintering pressure being 5 MPa or more, it is easy to obtain a sintered body having a sufficient density in which a relative density is about 98% or more, and it is possible to easily obtain a sintered body that can be practically provided in terms of strength. Meanwhile, in the case of the sintering pressure being 60 MPa or less, this is suitable for practical use in terms of cost. Further, in the case of the sintering temperature being 600° C. or higher, it is easy to obtain a sintered body having a relative density of 98% or more in which at least a portion of contacting surface between particles is fused and calcined, and it is possible to easily obtain a sintered body that can be practically provided in terms of strength. Meanwhile, in the case of the sintering temperature being 1000° C. or lower, damage of the sintered body can be suppressed, and it is possible to suppress that Mg suddenly vaporizes and disperses.

In the sintering step, similarly to the above-described heating and melting step, the temperature control of temperature rise and temperature decline is extremely important in order to produce a desired sintered body. Although described in detail in Examples, basically, the temperature and the time are controlled in several stages. For example, first, heating for rapidly increasing temperature is necessary such that heat is sufficiently transmitted to the center part of the filled polycrystalline magnesium silicide powder; however, thereafter, it is necessary to decrease the rate with a gradient of the first stage or the second or more stages and then stop heating to leave the sintered body such that the whole sintered body is not dissolved, and then to cool the sintered body over time. According to this, a sintered body in which particles are fused while grain boundaries without gaps are maintained is obtainable.

In addition, in the case of air being present in the sintering step, it is preferable to sinter under an atmosphere using an inert gas such as nitrogen or argon.

In the case of employing a pressurized compression sintering method in the sintering step, a hot-press sintering method (HP), a hot isostatic press sintering method (HIP), a spark plasma sintering method, and the like can be employed. Among these, the spark plasma sintering method is preferable.

The spark plasma sintering method is one type of the pressurized compression sintering methods using a DC pulse electric current method and is a method of performing sintering by applying a pulse of high current to various materials. In principle, the spark plasma sintering method is a method of causing the current to flow in conductive materials such as graphite and metal, and processing or treating a material by way of Joule heating. The sintered body produced in this way has a high yield and a high relative density, and in Examples described later, all 20 sintered bodies among 20 sintered bodies do not have chaps and the like, a high yield of 100%, and a high relative density of 98% or more, and thus those which extremely effective as a material for the thermoelectric conversion element are obtainable.

Further, since cracks or chaps are easily generated in the sintered body as the size of the sintered body increases, it is preferable that a metal binder is mixed in advance with the pulverized polycrystalline magnesium silicide powder and then sintered. According to this, generation of cracks and the like are suppressed, and it is effective to obtain a large-sized sintered body. The reason for this is considered that the melted metal binder enters a gap of the polycrystalline magnesium silicide powder and is solidified to strongly bind fine powders. As the metal binder, a compound, alloy, or intermetallic compound which includes at least metal powder of Ni, Zn, Al, Cu, Co, Ag, Au, and the like, or these elements and has a melting point of 419° C. to 1455° C.

Thermoelectric Conversion Element

The thermoelectric conversion element of present disclosure includes a thermoelectric conversion part configured from the sintered body obtained in the sintering step and first and second electrodes provided to the thermoelectric conversion part.

Thermoelectric Conversion Part

As the thermoelectric conversion part, a part made by cutting the sintered body obtained in the above sintering step to a desired size using a wire saw or the like can be used. The thermoelectric conversion part is usually produced using one type of thermoelectric conversion material; however, it may be made as a thermoelectric conversion part having a multi-layer structure using a plurality of types of thermoelectric conversion materials. A thermoelectric conversion part having a multi-layer structure can be produced by laminating a plurality of types of thermoelectric conversion materials prior to sintering in a desired order, and then sintering. As the plurality of types of thermoelectric conversion materials, at least one thermoelectric conversion material may be configured from the polycrystalline magnesium silicide of present disclosure, and in a case where two or more types of thermoelectric conversion materials are configured from the polycrystalline magnesium silicide of present disclosure, the amount of each dopant may be different. It may be a combination of the thermoelectric conversion material configured from the polycrystalline magnesium silicide of present disclosure and another thermoelectric conversion material of the conventional technology.

Electrode

The formation method of the first electrode and the second electrode provided on the thermoelectric conversion part is not particularly limited, and a plating method, a method of printing a conductive paste and then calcining the conductive paste, a sintering method specifically described later, or the like is exemplified. In those formation methods, a conductive layer for electrode is provided on the sintered body and then cut to a desired size using a wire saw or the like to form a thermoelectric conversion element in which the first electrode and the second electrode are provided on the thermoelectric conversion part. In the sintering method, polycrystalline magnesium silicide and an electrode material are integrally sintered at the same time. Further, as the electrode material, nickel, aluminum, copper, or the like is preferably used, but respective powders of the electrode material, the polycrystalline magnesium silicide and the electrode material are stacked in this order and subjected to pressurized compression sintering so that a sintered body having electrodes formed at both ends can be obtained. At this time, the aforementioned metal binder powder can also be mixed with the polycrystalline magnesium silicide powder.

Two methods will be described as formation methods of the electrode by a pressurized compression sintering method.

The first method stacks, to a predetermined thickness, a layer of an insulating material powder such as of $SiO_2$, a layer of a metallic powder for electrode formation such as of Ni, a layer of a pulverized material of the polycrystalline magnesium silicide of present disclosure, a layer of the above-described metallic powder for electrode formation, a layer of the above-described insulating material powder, inside of a cylindrical-type sintering tool composed of a graphite die and a punch made of graphite, for example, in sequence from a base thereof, followed by performing pressurized compression sintering.

The above-mentioned insulating material powder prevents electricity from flowing from the sintering device to the metallic powder for electrode formation, and thus effective in preventing melting, and the insulating material is separated from the electrodes formed after sintering.

In the first method, once carbon paper is interposed between the insulating material powder layer and the metallic powder for electrode formation layer, and carbon paper is further placed at the interior wall surface of the cylindrical-type sintering tool, it is effective in preventing the mixing of powders and in separating the electrodes and insulating material layer after sintering.

Since irregularities are formed on many of the top and bottom surface of the sintered body obtained in this way, it is necessary to smooth by polishing, followed by cutting to a predetermined size using a cutter such as that of a wire saw or saw blade, whereby a thermoelectric conversion element including the first electrode, the thermoelectric conversion part, and the second electrode.

According to a method not using an insulating material powder, the metallic powder for electrode formation will be melted by the current; therefore, it is difficult to adjust the current without being able to use high current, and consequently, there has been a problem in that the electrodes will peel off from the obtained sintered body. On the other hand, in the first method, high current can be used due to providing the insulating material powder layer, a result of which it is possible to suppress peeling of the electrodes from the sintered body.

The second method does not use the above-described insulating material powder layer of the above first method, and stacks a layer of a layer of a metallic powder for electrode formation such as of Ni, a layer of a pulverized material of the polycrystalline magnesium silicide of present disclosure, and a layer of the above-described metallic powder for electrode formation inside of a cylindrical-type sintering tool in sequence from the base thereof, then coats or sprays insulating, heat-resistant, and mold releasing ceramic particles such as of BN onto the surface of the above-described graphite die of the sintering tool contacting the layer of the above-described metallic powder for electrode formation, and then performs pressurized compression sintering. In this case, it is not necessary to use carbon paper as in the first method.

In addition to having all of the advantages of the first method, this second method has an advantage in that polishing is almost unnecessary since the top and bottom surfaces of the obtained sintered body are smooth. The method of cutting the obtained sintered body to a predetermined size to prepare the thermoelectric conversion element including the first electrode, the thermoelectric conversion part, and the second electrode is the same as the above-described first method.

Thermoelectric Conversion Module

The thermoelectric conversion module of present disclosure is provided with the thermoelectric conversion element of present disclosure.

Figure 2:
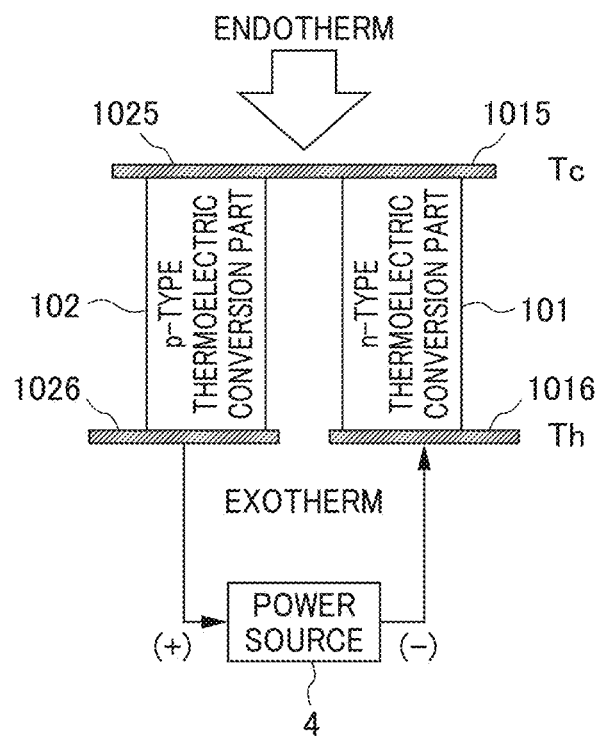
FIG. 2 is a view showing an example of a thermoelectric conversion module.

As one example of the thermoelectric conversion module, modules such as those shown in FIGS. 1 and 2 can be exemplified, for example. With these thermoelectric conversion modules, an n-type semiconductor and a p-type semiconductor obtained from the polycrystalline magnesium silicide of present disclosure are used as the thermoelectric conversion materials of an n-type thermoelectric conversion part 101 and a p-type thermoelectric conversion part 102, respectively. Electrodes 1015 and 1025 are provided to the upper end parts of the n-type thermoelectric conversion part 101 and the p-type thermoelectric conversion part 102, which are juxtaposed, and electrodes 1016 and 1026 are provided to the lower end parts thereof, respectively. Then, the electrodes 1015 and 1025 provided to the upper ends of the n-type thermoelectric conversion part and the p-type thermoelectric conversion part are connected to form an integrated electrode, and the electrodes 1016 and 1026 provided to the lower ends of the n-type thermoelectric conversion part and the p-type thermoelectric conversion part, respectively, are configured to be separated.

In the thermoelectric conversion module shown in FIG. 1, the side of the electrodes 1015 and 1025 is heated, and radiates from the side of the electrodes 1016 and 1026, whereby a positive temperature differential (Th-Tc) arises between the electrodes 1015 and 1025 and the electrodes 1016 and 1026, respectively, and the p-type thermoelectric conversion part 102 becomes higher potential than the n-type thermoelectric conversion part 101 due to thermally excited carrier. At this time, current flows from the p-type thermoelectric conversion part 102 to the n-type thermoelectric conversion part 101 by connecting a resistor 3 as a load between the electrode 1016 and the electrode 1026.

In the thermoelectric conversion module shown in FIG. 2, by flowing a DC current from the p-type thermoelectric conversion part 102 to the n-type thermoelectric conversion part 101 using a DC power source 4, and endothermic effect arises at the electrodes 1015 and 1025, and an exothermic effect arises at the electrodes 1016 and 1026. In addition, by flowing a DC current from the n-type thermoelectric conversion part 101 to the p-type thermoelectric conversion part 102, an exothermic effect arises at the electrodes 1015 and 1025, and an endothermic effect arises at the electrodes 1016 and 1026.

Figure 3:
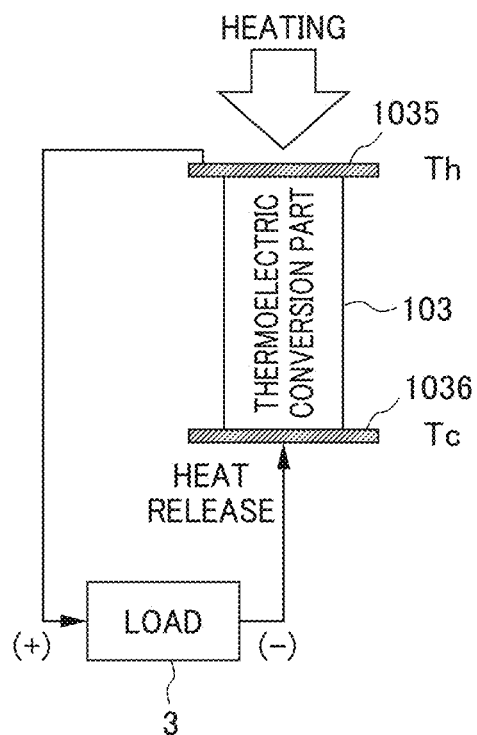
FIG. 3 is a view showing an example of a thermoelectric conversion module.
Figure 4:
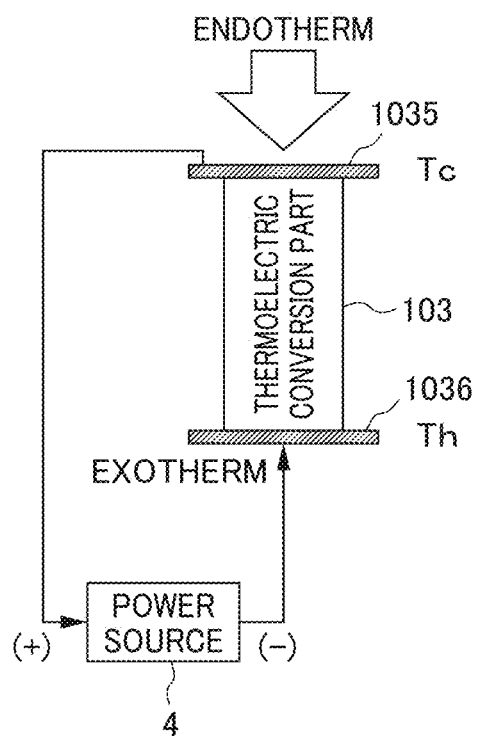
FIG. 4 is a view showing an example of a thermoelectric conversion module.

In addition, as another example of a thermoelectric conversion module, modules such as those shown in FIGS. 3 and 4 can be exemplified, for example. With these thermoelectric conversion modules, an n-type semiconductor obtained from the polycrystalline magnesium silicide of present disclosure is used as the thermoelectric conversion material of an n-type thermoelectric conversion part 103. An electrode 1035 is provided to an upper end part of the n-type thermoelectric conversion part 103, and an electrode 1036 is provided to a lower end part thereof.

In the thermoelectric conversion module shown in FIG. 3, the side of the electrode 1035 is heated and radiates from the side of the electrode 1036, whereby a positive temperature differential (Th-Tc) arises between the electrode 1035 and the electrode 1036, and the side of the electrode 1035 becomes higher potential than the side of the electrode 1036. At this time, current flows from the side of the electrode 1035 to the side of the electrode 1036 by connecting the resistor 3 as a load between the electrode 1035 and the electrode 1036.

In the thermoelectric conversion module shown in FIG. 4, by flowing a DC current from the side of the electrode 1036 to the side of the electrode 1035 through the n-type thermoelectric conversion part 103 using the DC power source 4, an endothermic effect arises at the electrode 1035, and an exothermic effect arises at the electrode 1036. In addition, by flowing a DC current from the side of the electrode 1035 to the electrode 1036 through the n-type thermoelectric conversion part 103 using the DC power source 4, an exothermic effect arises at the electrode 1035, and an endothermic effect arises at the electrode 1036.

EXAMPLES

Hereinafter, the present invention will be described by means of Examples; however, the present invention is not limited to these Examples.

Example 1

A starting material composition (66.33 at % Mg, 33.17 at % Si, 0.5 at % fullerene) was obtained by mixing high-purity silicon, magnesium, and fullerene (C60). It should be noted that, as the high-purity silicon, granular silicon of semiconductor grade having a purity of 99.9999999% and a size of 4 mm or less diameter manufactured by MEMO Electronic Materials Corp. was used. In addition, as the Mg, magnesium pieces having a purity of 99.93% and a size of 1.4 mm×0.5 mm manufactured by Nippon Thermochemical Co., Ltd. were used. Further, as the fullerene (C60), powdery fullerene having a purity of 99.9% or more (melting point: 1453 K) manufactured by SES Research Inc. was used.

The above-described starting material composition was charged into a melting crucible made of $Al_2O_3$ (manufactured by Nihon Kagaku Togyo Kabushiki Kaisha, 34 mm inside diameter, 40 mm outside diameter, 150 mm height; lid portion, 40 mm diameter, 2.5 mm thickness). As the melting crucible, one was used in which the contacting surface of the edge of the opening portion to the lid portion and the contacting surface of the lid portion to the edge of the opening portion have been polished so as to have a surface roughness Ra of 0.5 μm and a surface waviness Rmax of 1.0 μm. The edge of the opening portion of the melting crucible and the lid portion were made to closely contact, left to stand inside a heating furnace, and then the pressure was increased with weight via ceramic rods from outside of the heating furnace so as to be 3 kg/cm².

Next, the inside of the heating furnace was decompressed with a rotary pump until no more than 5 Pa, and then decompressed until $1.33 \times 10^{-2}$ Pa with a diffusion pump. In this state, the inside of the heating furnace was heated at 200° C./h until reaching 150° C., and then maintained at 150° C. for 1 hour to dry the starting material. At this time, mixed gas of hydrogen gas and argon gas filled inside of the heating furnace, with the partial pressure of hydrogen gas being 0.005 MPa and the partial pressure of argon gas being 0.052 MPa.

Thereafter, the starting material composition was dissolved by being heated rapidly at a rate of 400° C./h until the temperature reached 1105° C., and then was held at 1105° C. for 3 hours such that the starting material composition was completely melted. Thereafter, fine crystal grains were precipitated by being cooled rapidly at a rate of 100° C./h from 1105° C. to 900° C. and were further cooled rapidly at a rate of 1000° C./h from 900° C. to room temperature. As a result, the grain growth of crystals was suppressed to obtain a melted and solidified material (ingot) without voids.

The sample after heating and melting was pulverized until 25 μm to 75 μm using an alumina mortar to obtain a fine powder passing through a 75 μm sieve. Then, 2.5 g of the pulverized polycrystalline magnesium silicide powder was loaded in a space enclosed by the graphite die 10 of 15 mm inside diameter and the punches 11a and 11b made of graphite, as shown in FIG. 24. In order to prevent adhering to the punches, carbon paper was interposed between the top and bottom ends of the fine powder. Thereafter, sintering was performed under an argon atmosphere using a spark plasma sintering apparatus ("PAS-III-Es" manufactured by ELENIX Co., Ltd.). The temperature conditions in sintering were as follows.

Sintering temperature: 850° C.
Pressure: 50.0 MPa
Temperature rising rate: Rate (1) 300° C./min×2 min (to 600° C.)
Rate (2) 100° C./min×1.5 min (600° C. to 750° C.)
Rate (3) 10° C./min×13 min (750° C. to 880° C.)
Rate (4) 0° C./min×15 min (880° C.)
Cooling conditions: Rate (5) vacuum cooling
Atmosphere: Ar 60 Pa (vacuum during cooling)

The temperature conditions in sintering will be described in more detail. In the rate (1), the temperature is increased rapidly at a rate of 300° C./min until the temperature reached 600° C. such that heat is transmitted to the center part of the filled polycrystalline magnesium silicide powder, in the next rate (2), the temperature rising rate is decreased, in the rate (3), heating is performed by further decreasing the temperature rising rate such that the whole polycrystalline magnesium silicide powder is not dissolved, and then in the rate (4), the polycrystalline magnesium silicide powder is maintained without being heated. Thereafter, in the rate (5), cooling is performed over time, and particles are fused while grain boundaries without gaps are maintained.

After sintering, the adhered carbon paper was removed with sand paper to obtain a polycrystalline magnesium silicide sintered body containing 0.5 at % of carbon (C (fullerene) 0.5 at %-added $Mg_2Si$). It should be noted that the shape of the obtained sintered body is a cylindrical shape (the top surface and the bottom surface being a circle of 15 mm diameter and having a height of 6.5 mm).

Example 2

A polycrystalline magnesium silicide sintered body (C (fullerene) 1.0 at %-added $Mg_2Si$) was obtained by the same method as Example 1, except that high-purity silicon, magnesium, and fullerene (C60) were mixed to obtain a starting material composition (66.0 at % Mg, 33.0 at % Si, 1.0 at % fullerene).

Comparative Example 1

A polycrystalline magnesium silicide sintered body (Sb 0.5 at %-added $Mg_2Si$) was obtained by the same method as Example 1, except that high-purity silicon, magnesium, and antimony were mixed to obtain a starting material composition (66.33 at % Mg, 33.17 at % Si, 0.5 at % Sb). It should be noted that, as antimony, granular antimony having a purity of 99.9999% and a size of 5 mm or less diameter manufactured by ELECTRONICS AND MATERIALS CORPORATION LIMITED was used.

Comparative Example 2

A polycrystalline magnesium silicide sintered body (undoped) was obtained by the same method as Example 1, except that high-purity silicon and magnesium were mixed to obtain a starting material composition (66.67 at % Mg, 33.33 at % Si).

Comparative Example 3

A polycrystalline magnesium silicide sintered body (C (graphite) 0.1 at %-added $Mg_2Si$) was obtained by the same method as Example 1, except that high-purity silicon, magnesium, and graphite (melting point: 3823 K) were mixed to obtain a starting material composition (66.6 at % Mg, 33.3 at % Si, 0.1 at % graphite).

Comparative Example 4

A polycrystalline magnesium silicide sintered body (C (graphite) 0.5 at %-added $Mg_2Si$) was obtained by the same method as Example 1, except that high-purity silicon, magnesium, and graphite were mixed to obtain a starting material composition (66.33 at % Mg, 33.17 at % Si, 0.5 at % graphite).

Comparative Example 5

A polycrystalline magnesium silicide sintered body (C (graphite) 1.0 at %-added $Mg_2Si$) was obtained by the same method as Example 1, except that high-purity silicon, magnesium, and graphite were mixed to obtain a starting material composition (66.0 at % Mg, 33.0 at % Si, 1.0 at % graphite).

Evaluation

Appearance Photograph and Optical Microscope Photograph

Appearance photographs and optical microscope photographs of the polycrystalline magnesium silicide sintered bodies obtained in Examples 1 and 2 are shown in FIG. 5.

The optical microscope photographs shown in FIG. 5 are obtained by observing mirror surfaces which are obtained by subjecting the surfaces of the sintered bodies to mechanical polishing. As shown in the appearance photographs and the optical microscope photographs of FIG. 5, it was possible to obtain a sintered body without cracks in both Examples 1 and 2. Further, although 20 sintered bodies in each of Examples 1 and 2 were produced, all the sintered bodies did not have cracks, crack-free sintered bodies having favorable reproducibility were obtainable, and the yield was 100%.

Calculation of Relative Density

The relative density of each of the polycrystalline magnesium silicide sintered bodies obtained in Examples 1 and 2 was calculated. First, the density of each of the sintered bodies obtained in Examples 1 and 2 was calculated by Archimedes method and the true density was measured using Gas Pycnometer (manufactured by Micromeritics Instrument Corporation) by a gas phase (He, gas) substitution method. Then, the relative density was calculated from the ratio of the density calculated by Archimedes method to the true density. It should be noted that the true density in Example 1 was 2.01 $g/cm^3$ and the true density in Example 2 was 2.00 $g/cm^3$.

As shown in FIG. 5, both the relative densities of the polycrystalline magnesium silicide sintered bodies obtained in Examples 1 and 2 were 98% or more, and the sintered bodies were dense. Therefore, it is found from the true density and the relative density that the polycrystalline magnesium silicide of this disclosure has high sinterability.

SEM Image and EPMA Measurement

Figure 6:
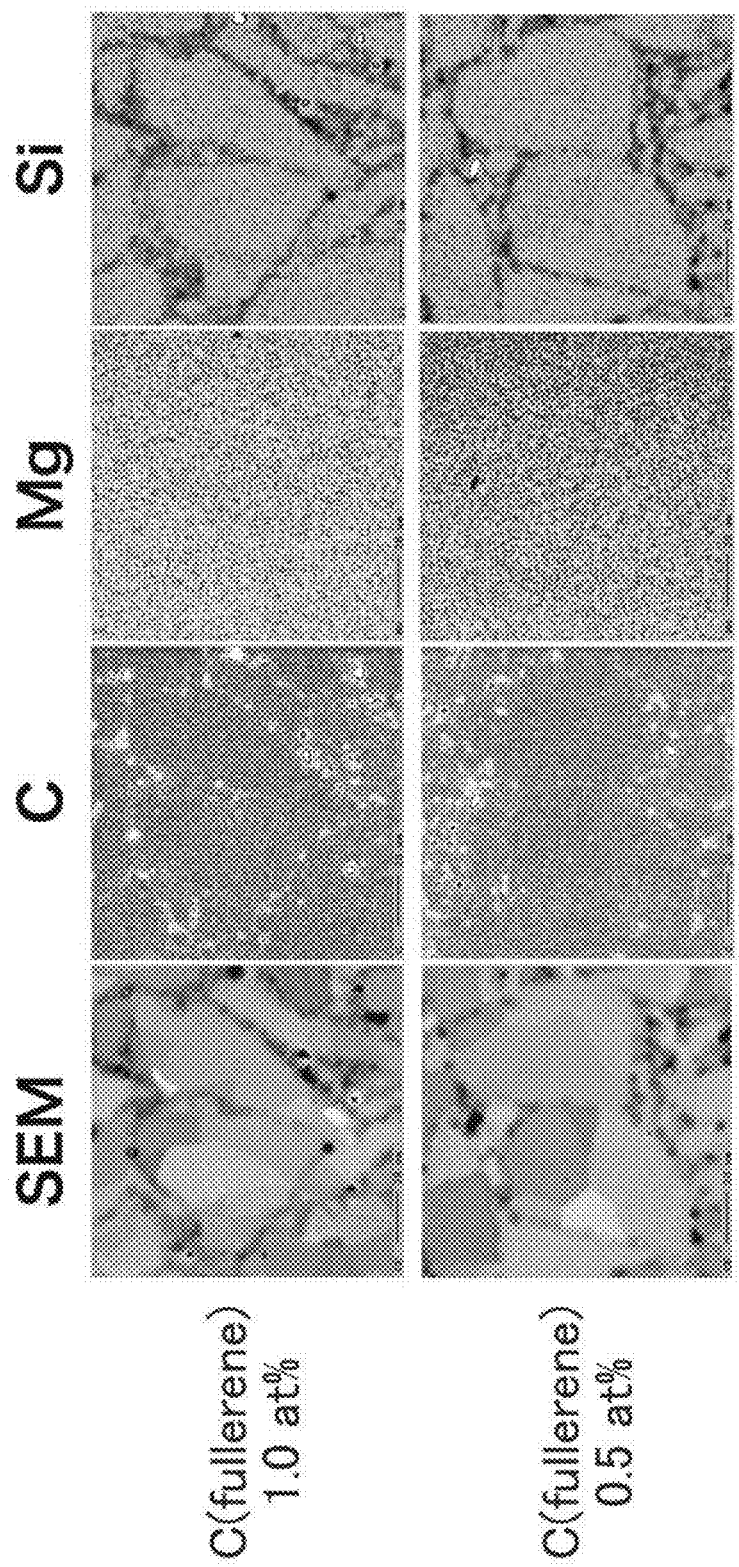
FIG. 6 shows SEM images and images showing EPMA measurement results of the polycrystalline magnesium silicide sintered bodies in Example 1 and Example 2.

Regarding the polycrystalline magnesium silicide sintered bodies obtained in Examples 1 and 2, in order to check whether carbon is dissolved, elemental analysis of C, Mg, and Si was performed using JXA-8900 Electron Probe Microanalyzer (EPMA) manufactured by JEOL Ltd. SEM images and EPMA measurement results of the polycrystalline magnesium silicide sintered bodies in Examples 1 and 2 are shown in FIG. 6. As shown in FIG. 6, it is found that, similarly to Mg and Si, a uniform mapping result of C is obtained and C is distributed at crystal grain boundaries and within crystal grains.

SEM-EDX Measurement

Figure 19:
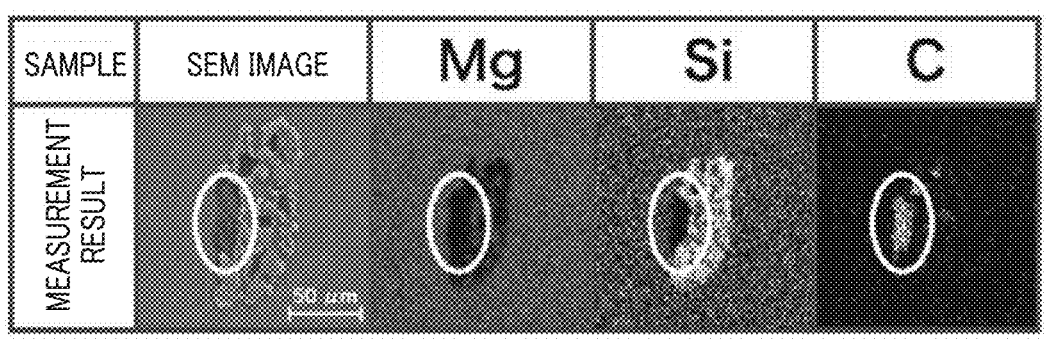
FIG. 19 is an image showing the measurement result of a polycrystalline magnesium silicide sintered body in Comparative Example 5 by SEM-EDX.

The polycrystalline magnesium silicide sintered body obtained in Comparative Example 5 was subjected to scanning electron microscope-energy dispersive X-ray spectroscopy (SEM-EDX) measurement. The result of SEM-EDX measurement is shown in FIG. 19. From the SEM image shown in FIG. 19, it is found that, in the polycrystalline magnesium silicide sintered body obtained in Comparative Example 5, C elementary substance of several tens of μm exists, carbon is not distributed within grains, and carbon is also not distributed at crystal grain boundaries.

Result of X-Ray Diffraction

Figure 7:
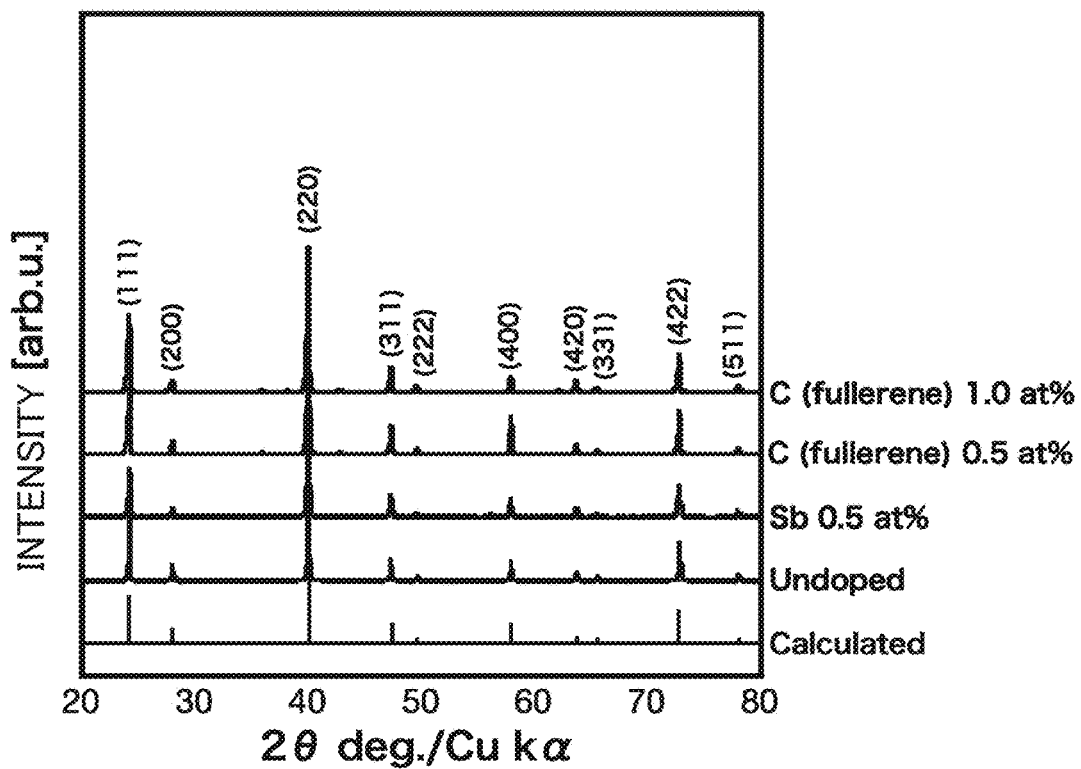
FIG. 7 is a view showing the result of X-ray diffraction of polycrystalline magnesium silicide sintered bodies of Examples 1 and 2 and Comparative Examples 1 and 2.

The polycrystalline magnesium silicide sintered bodies obtained in Examples 1 and 2 and Comparative Examples 1 and 2 were subjected to X-ray diffraction (XRD) using Altima IV (manufactured by Rigaku Corporation). In X-ray diffraction, CuKα ray was used, the applied voltage was set to 40 kV, and the applied current was set to 40 mA. The results of X-ray diffraction of the magnesium silicide sintered bodies in Examples 1 and 2 and Comparative Examples 1 and 2 are shown in FIG. 7. It should be noted that, in FIG. 7, as comparison targets of Examples 1 and 2, Comparative Example 1 (Sb 0.5 at %-added $Mg_2Si$), Comparative Example 2 (undoped $Mg_2Si$), and theoretical peak (Calculated) of $Mg_2Si$ are provided.

From the peaks observed in FIG. 7, it was confirmed that $Mg_2Si$ is formed in Examples 1 and 2 added with fullerene as a dopant. Further, in FIG. 7, peaks of carbon (fullerene), SiC, Mg, and Si were not confirmed in Examples 1 and 2. From this point, it is also found that carbon derived from added fullerene is distributed at crystal grain boundaries and within crystal grains and unreacted Mg and unreacted Si do not exist. If unreacted Mg does not exist, MgO causing occurrence of cracks is not generated, and thus, as described above, the sintered body has high sinterability and excellent mechanical durability.

Figure 23:
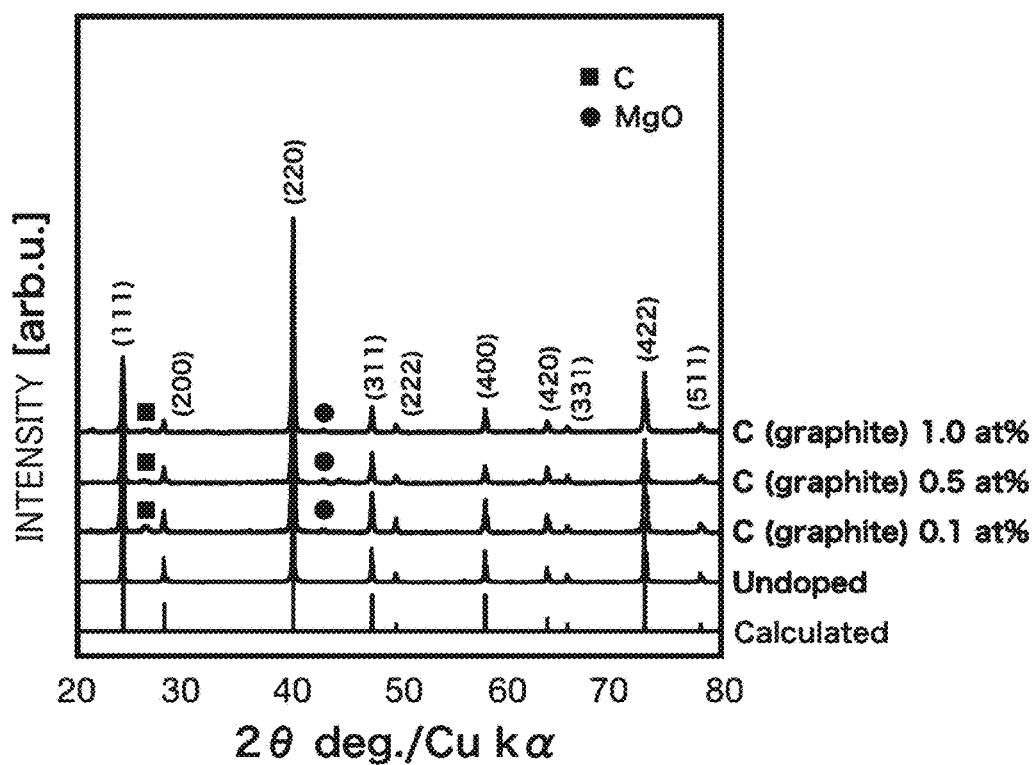
FIG. 23 is a view showing the result of X-ray diffraction of the polycrystalline magnesium silicide sintered bodies in Comparative Examples 2 to 5.

Further, the polycrystalline magnesium silicide sintered bodies obtained in Comparative Examples 3 to 5 were also subjected to X-ray diffraction in the same manner as described above. The results of X-ray diffraction of the polycrystalline magnesium silicide sintered bodies in Comparative Examples 2 to 5 are shown in FIG. 23. It should be noted that, in FIG. 23, as comparison targets of Comparative Examples 3 to 5, Comparative Example 2 (undoped $Mg_2Si$) and the theoretical peak (Calculated) of polycrystalline magnesium silicide are provided.

From the peaks observed in FIG. 23, the peak of SiC was not confirmed but the peak of carbon (graphite) was observed in Comparative Examples 3 to 5 added with graphite as a dopant. From this point, it is found that carbon derived from added graphite is not distributed within grains of $Mg_2Si$.

Evaluation

Measurement of Seebeck Coefficient, Electrical Conductivity, and Thermal Conductivity The polycrystalline magnesium silicide sintered bodies obtained in Examples 1 and 2 and Comparative Examples 1 and 2 were cut to a size of 2 mm length, 2 mm width, and 12 mm height using a wire saw, and the Seebeck coefficient and the electrical conductivity were measured using ZEM-3 manufactured by ADVANCE-RIKO, Inc. The power factor was calculated from the obtained Seebeck coefficient and electrical conductivity. Similarly, the polycrystalline magnesium silicide sintered bodies obtained in Examples 1 and 2 and Comparative Examples 1 and 2 were cut to a size of 7 mm length, 7 mm width, and 1 mm height using a wire saw, and the thermal conductivity was measured using TC-1200RH manufactured by ADVANCE-RIKO, Inc. Further, regarding the thermal conductivity, the thermal conductivity (carrier thermal conductivity) of electron component and the thermal conductivity (lattice thermal conductivity) of lattice component were obtained according to Wiedemann-Franz Law. Furthermore, the dimensionless figure-of-merit parameter ZT was calculated according to the above-described Equation (1) from the obtained power factor and thermal conductivity. It should be noted that, in regard to each parameter, a measurement temperature range was 327 K to 873 K and measurement was performed every 50 K.

Figure 12:
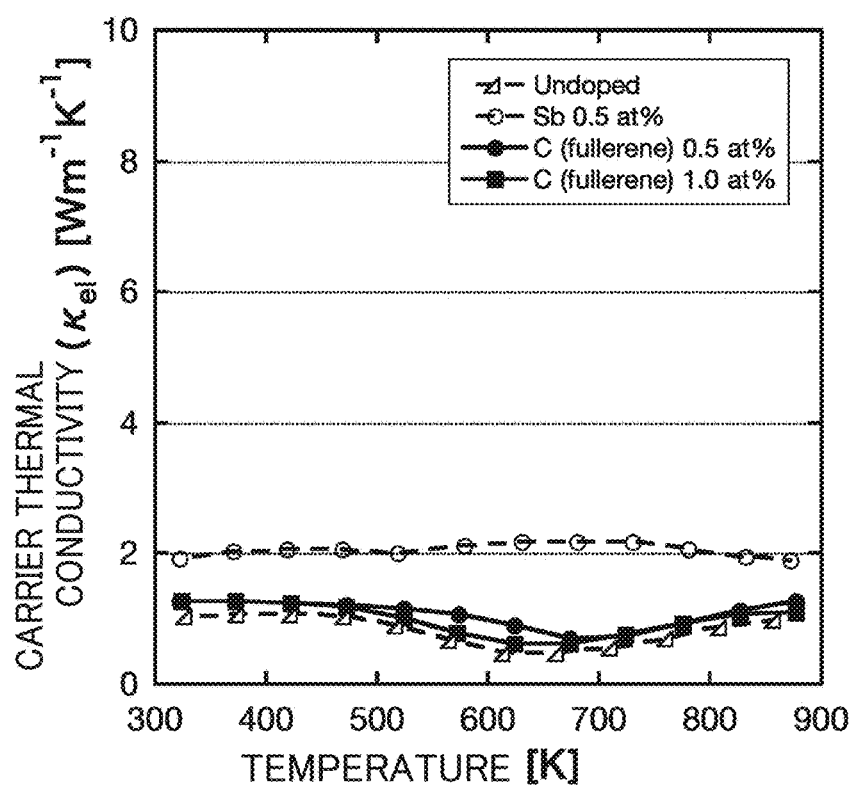
FIG. 12 is a graph showing a relation between a temperature and carrier thermal conductivity of the polycrystalline magnesium silicide sintered bodies in Examples 1 and 2 and Comparative Examples 1 and 2.
Figure 13:
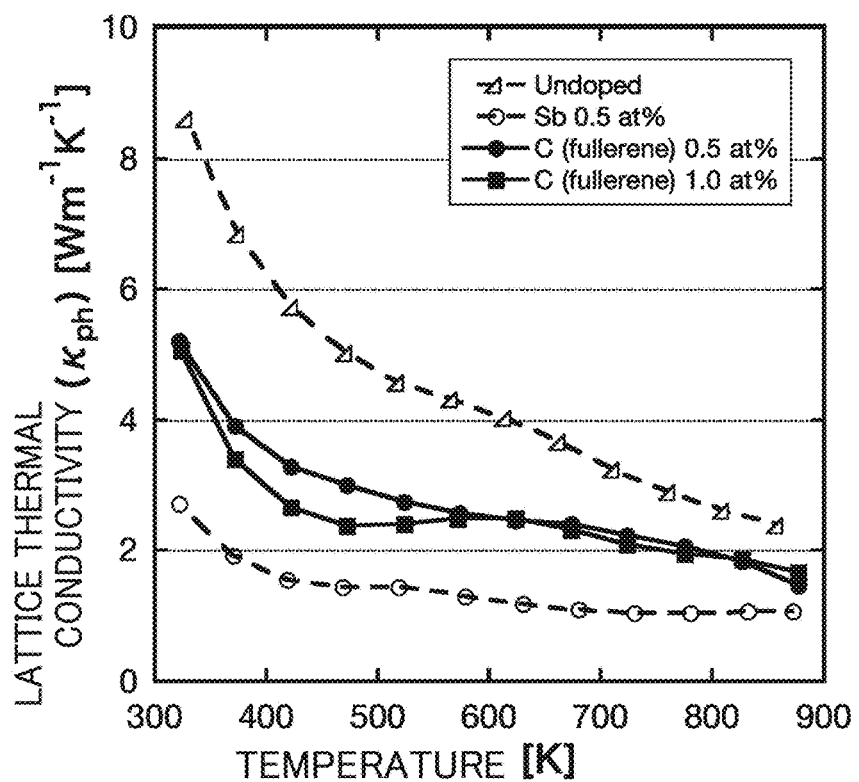
FIG. 13 is a graph showing a relation between a temperature and lattice thermal conductivity of the polycrystalline magnesium silicide sintered bodies in Examples 1 and 2 and Comparative Examples 1 and 2.

Relations between a temperature and the Seebeck coefficient, the electrical resistivity, the power factor, or the thermal conductivity of the polycrystalline magnesium silicide sintered bodies in Examples 1 and 2 and Comparative Examples 1 and 2 are shown in FIGS. 8 to 11. Further, relations between a temperature and the carrier thermal conductivity or the lattice thermal conductivity of the polycrystalline magnesium silicide sintered bodies in Examples 1 and 2 and Comparative Examples 1 and 2 are shown in FIGS. 12 and 13.

Seebeck Coefficient and Electrical Resistivity

Figure 8:
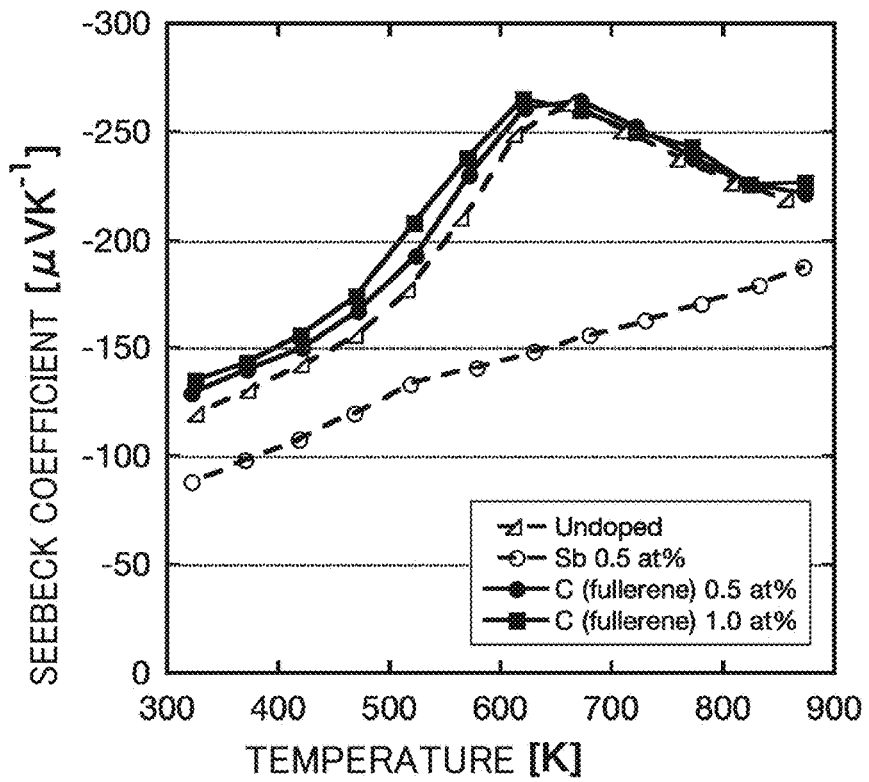
FIG. 8 is a graph showing a relation between a temperature and a Seebeck coefficient of the polycrystalline magnesium silicide sintered bodies in Examples 1 and 2 and Comparative Examples 1 and 2.

Although the amounts of fullerene added in Examples 1 and 2 are different, as shown in FIGS. 8 and 9, there is almost no difference between behaviors of the Seebeck coefficient and the electrical conductivity with respect to a temperature change, there is also no difference with the undoped one of Comparative Example 2, and this indicates that carbon derived from fullerene functions as isoelectronic impurities. On the other hand, in Comparative Example 1 added with antimony, there is a difference with the undoped one of Comparative Example 2, the Seebeck coefficient is decreased, and the electrical conductivity is enhanced, so that the behavior of n-type impurities that releases carriers is clearly shown.

Power Factor

The power factor is an index for a power amount which can be extracted when a temperature difference is provided to a thermoelectric conversion element as described above, and as a numerical value of the power factor increases, an output density also increases. As shown in FIG. 10, the power factor in a low-middle temperature range of 327 K to 600 K is $2.6 \times 10^{-3}$ $Wm^{-1}K^{-2}$ to $3.3 \times 10^{-3}$ $Wm^{-1}K^{-2}$ in Examples 1 and 2 added with fullerene; whereas the power factor is low, that is, $1.9 \times 10^{-3}$ $Wm^{-1}K^{-2}$ to $3.0 \times 10^{-3}$ $Wm^{-1}K^{-2}$ in Comparative Example 1 added with antimony, and particularly, the latter is not practical as a thermoelectric conversion module for automobiles. Further, when the power factors at 327 K in Examples 1 and 2 and Comparative Example 1 are compared, it is found that the average value in Examples 1 and 2 is about $2.75 \times 10^{-3}$ $Wm^{-1}K^{-2}$, the average value in Comparative Example 1 is about $1.9 \times 10^{-3}$ $Wm^{-1}K^{-2}$, and the former is larger by about 45%. Since the power factor is high in a temperature range around 327 K, it is effective that heat generated when operating home electrical appliance and office machines (such as a personal computer and a projector) is utilized in power generation. Furthermore, the power factor of Examples 1 and 2 are about $2.7 \times 10^{-3}$ $Wm^{-1}K^{-2}$ to about $3.3 \times 10^{-3}$ $Wm^{-1}K^{-2}$ in a low-middle temperature range of 327 K to 600 K, the maximum value $3.3 \times 10^{-3}$ $Wm^{-1}K^{-2}$ is a value at about 523 K, and it is found that the polycrystalline magnesium silicide sintered bodies in Examples 1 and 2 have particularly excellent thermoelectric conversion performance in a middle temperature range.

On the other hand, the power factor of the polycrystalline magnesium silicide added with antimony gradually increases according to an increase in temperature at a starting point of $1.9 \times 10^{-3}$ $Wm^{-1}K^{-2}$ at 327 K, and the power factor is about $2.7 \times 10^{-3}$ $Wm^{-1}K^{-2}$ in a middle temperature range of 523 K and is about $3.2 \times 10^{-3}$ $Wm^{-1}K^{-2}$ of the maximum value in a high-temperature range of 720 K. The power factor in a middle temperature range of about 523 K of the polycrystalline magnesium silicide of this disclosure containing carbon is larger than that of antimony-doped one by about 23%. In this way, the polycrystalline magnesium silicide of present disclosure containing carbon has a large power factor in a low-middle temperature range, this means that a large amount of power can be extracted, and is extremely effective for automobiles where most of exotherm is in a low-middle temperature range, particularly, an exothermic temperature is in a middle temperature range. It should be noted that, in the case of Comparative Example 2 using undoped polycrystalline magnesium silicide, the power factor thereof is lower than those of Examples 1 and 2, and this is significant particularly in the case of a low-middle temperature range.

Thermal Conductivity

Figure 11:
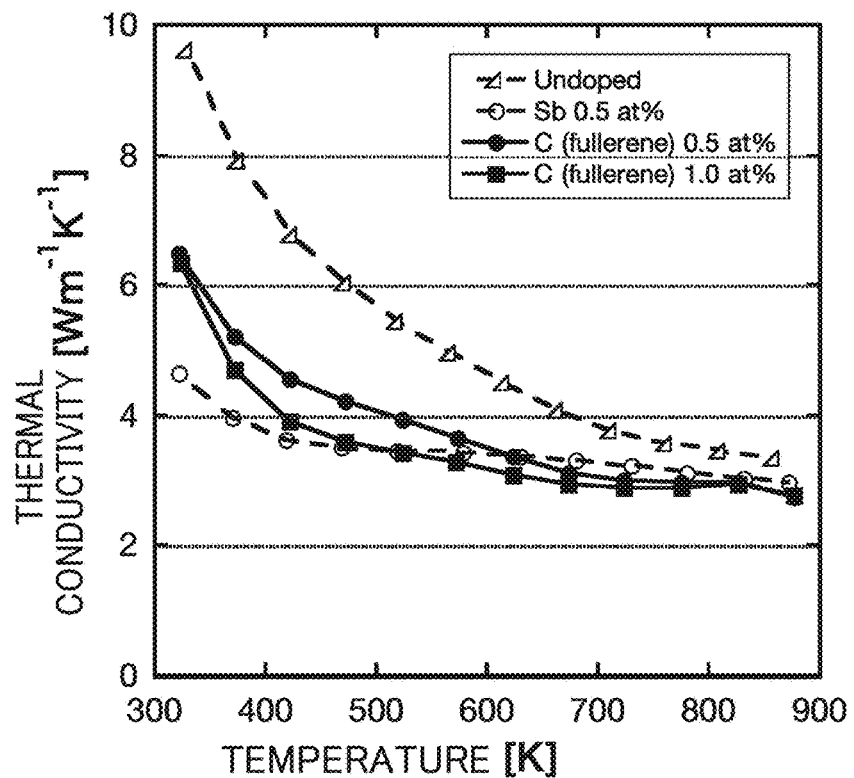
FIG. 11 is a graph showing a relation between a temperature and thermal conductivity of the polycrystalline magnesium silicide sintered bodies in Examples 1 and 2 and Comparative Examples 1 and 2.

As shown in FIG. 11, when the thermal conductivity is observed, it is found that, although there is no large difference between the polycrystalline magnesium silicide of present disclosure containing carbon (Examples 1 and 2) and polycrystalline magnesium silicide added with antimony (Comparative Example 1) and the former has a slightly higher value at 450 K to 650 K, all of the cases have a lower thermal conductivity than undoped polycrystalline magnesium silicide (Comparative Example 2).

Further, when the carrier thermal conductivity is observed, as shown in FIG. 12, it is found that, although the amounts of fullerene added in Examples 1 and 2 are different, there is almost no difference in behavior with respect to a temperature change, and a difference with the case of undoped polycrystalline magnesium silicide of Comparative Example 2 is also not observed, and carbon derived from fullerene functions as isoelectronic impurities. On the other hand, the carrier thermal conductivity of Comparative Example 1 of antimony-doped one shows a higher value than that of the undoped one of Comparative Example 2, and antimony exhibits the behavior of n-type dopant.

On the other hand, when the lattice thermal conductivity is observed, as shown in FIG. 13, it is found that, in the case of polycrystalline magnesium silicide using fullerene (Examples 1 and 2), the lattice thermal conductivity changes to be largely decreased as compared to the case of undoped polycrystalline magnesium silicide (Comparative Example 2). When Example 1 and Example 2 are compared in a low-middle temperature range (327 K to 600 K), in a case where the amount of fullerene added is large, the lattice thermal conductivity is slightly decreased. The reason for this is speculated that the amount of carbon distributed within grains of polycrystalline magnesium silicide increases by increasing the amount of fullerene added, and accordingly, phonon scattering induction increases.

Dimensionless Figure-of-Merit Parameter ZT

Figure 14:
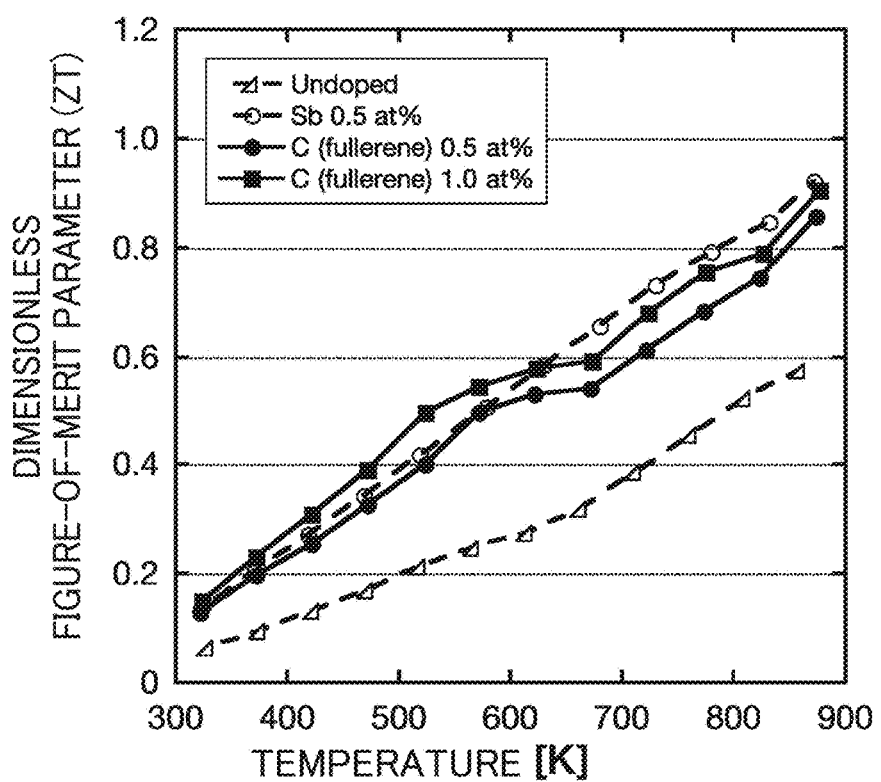
FIG. 14 is a graph showing a relation between a temperature and a dimensionless figure-of-merit parameter of the polycrystalline magnesium silicide sintered bodies in Examples 1 and 2 and Comparative Examples 1 and 2.

As shown in FIG. 14, ZT at 873 K of polycrystalline magnesium silicides containing carbon in Example 1 and Example 2 are 0.88 and 0.90, respectively, and ZT of polycrystalline magnesium silicide doped with antimony of Comparative Example 1 is 0.92, that is, shows almost the same value. Further, when comparing to polycrystalline magnesium silicide doped with antimony in Comparative Example 1, at 327 K to 550 K, the case of polycrystalline magnesium silicide using 1.0 at % of fullerene in Example 2 shows a high ZT values, and the case of polycrystalline magnesium silicide using 0.5 at % of fullerene in Example 1 shows the same ZT value.

Figure-of-Merit Parameter Z

Figure 15:
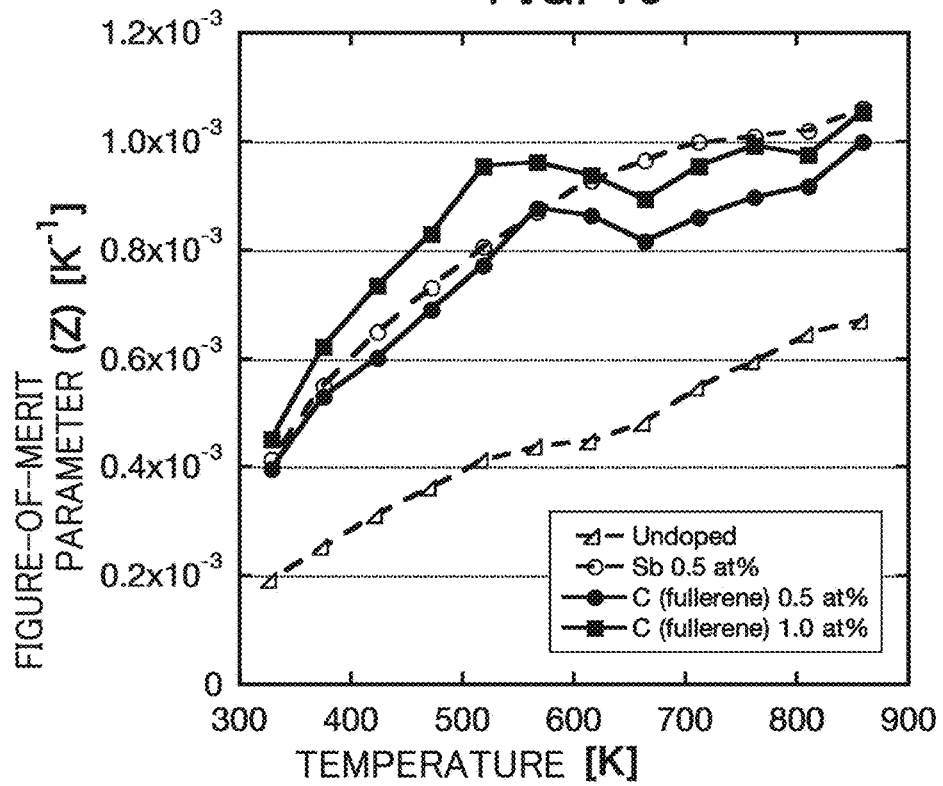
FIG. 15 is a graph showing a relation between a temperature and a figure-of-merit parameter of the polycrystalline magnesium silicide sintered bodies in Examples 1 and 2 and Comparative Examples 1 and 2.

It should be noted that, since the dimensionless figure-of-merit parameter (ZT=$S^2\sigma T/\kappa$) is proportional to the absolute temperature T, an apparent ZT value is decreased more in a low-middle temperature range than in a high-temperature range; however, when the figure-of-merit parameter (Z value) shown in FIG. 15 is observed, the polycrystalline magnesium silicide of present disclosure using fullerene shows a high value of $0.8 \times 10^{-3}$ (Z) [$K^{-1}$] or more that is almost the same level at 500 K to 900 K, and in the case of 1.0 at % of fullerene in Example 2, a value of $1.0 \times 10^{-3}$ (Z) [$K^{-1}$] or more at 877 K is shown. Furthermore, it is further clearly understood from the figure-of-merit parameter (Z value) that, when the value of the figure-of-merit parameter in a middle temperature range of 523 K is $0.9 \times 10^{-3}$ (Z) [$K^{-1}$] or more, the polycrystalline magnesium silicide of present disclosure using fullerene has a higher figure-of-merit parameter value together with a power factor value than polycrystalline magnesium silicide doped with antimony and is more excellent in performance in a low-middle temperature range than in a high-temperature range.

As described above, it is found that, in Example 1 and Example 2 in which only carbon is distributed as a dopant within grains in polycrystalline magnesium silicide without n-type impurities being concurrently used, the carbon acts as isoelectronic impurities to change only the lattice thermal conductivity without each value of the Seebeck coefficient, the electrical conductivity, and the carrier thermal conductivity being changed while each value thereof is kept to be almost the same as those in the undoped one, so that desired performance is brought about. That is, in the polycrystalline magnesium silicide of present disclosure containing only carbon as a dopant, all of the values of the Seebeck coefficient, the electrical conductivity, and the carrier thermal conductivity are almost the same as those in the undoped one, this indicates the behavior as isoelectronic impurities, and desired various effects including the effect of decreasing the number of thermoelectric conversion elements are brought about. If one doped with antimony is discussed, the values thereof are two to four times higher than those in the undoped one.

Magnesium Silicide Using Graphite (Comparative Examples 3 to 5)

Next, the Seebeck coefficient and the electrical conductivity of each of the polycrystalline magnesium silicide sintered bodies obtained in Comparative Examples 3 to 5 were measured in the same manner as the above-described method, the power factor was calculated from the obtained results, and measurement of the thermal conductivity was performed in the same manner as the above-described method. Furthermore, the dimensionless figure-of-merit parameter ZT was calculated according to the above-described Equation (1) from the obtained power factor and thermal conductivity. The results are shown in FIGS. 20 to 22, respectively.

Figure 20:
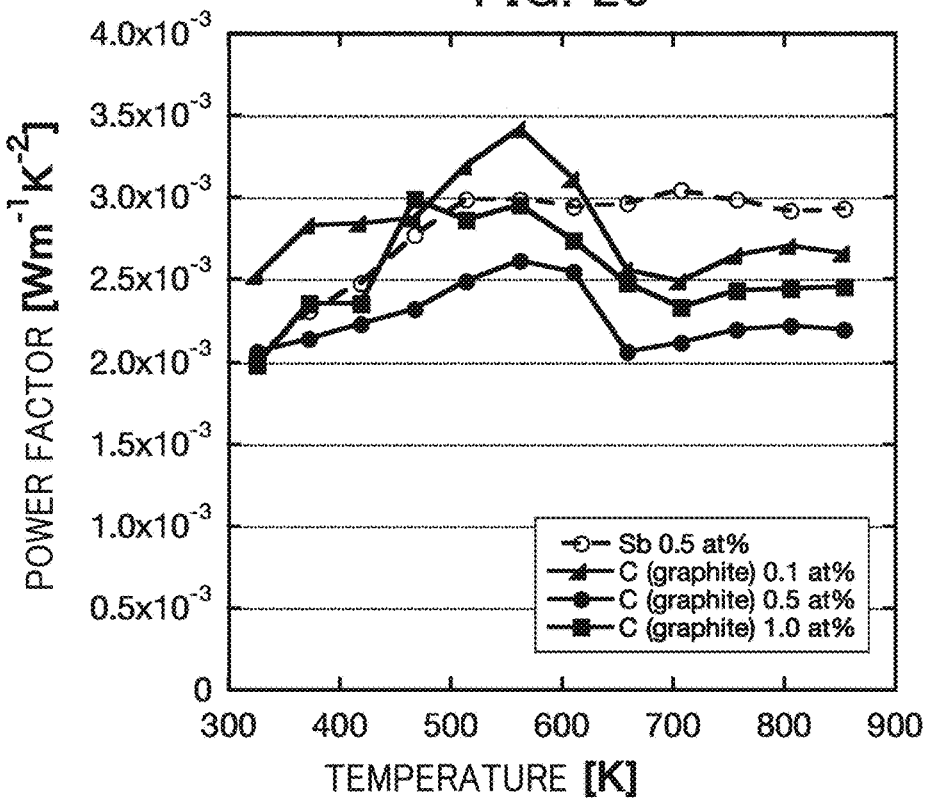
FIG. 20 is a graph showing a relation between a temperature and a power factor of polycrystalline magnesium silicide sintered bodies in Comparative Examples 1 and 3 to 5.
Figure 21:
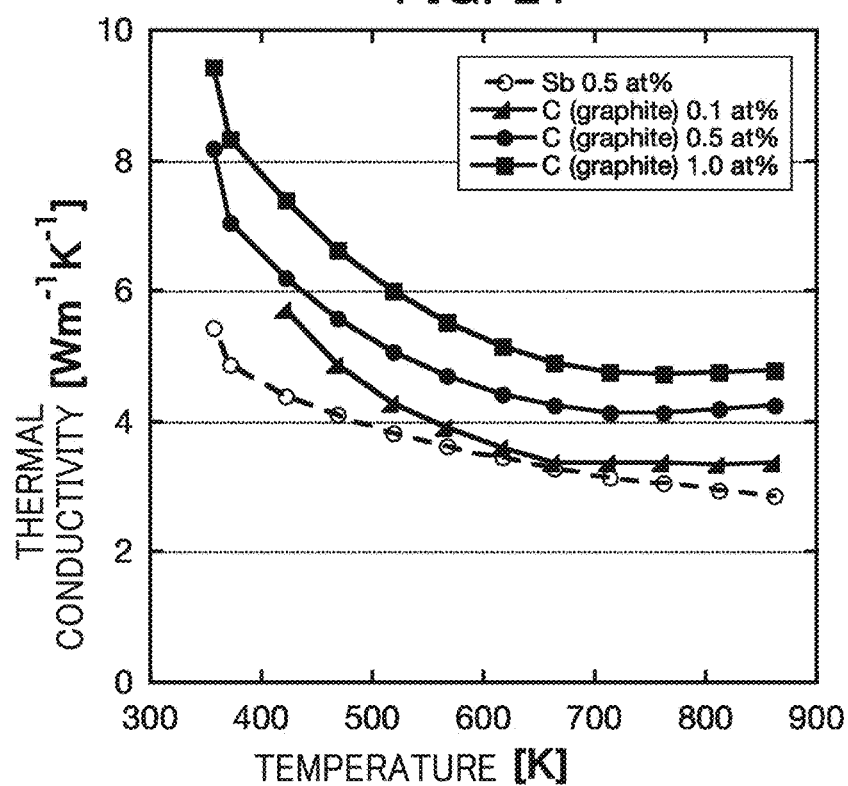
FIG. 21 is a graph showing a relation between a temperature and thermal conductivity of the polycrystalline magnesium silicide sintered bodies in Comparative Examples 1 and 3 to 5.
Figure 22:
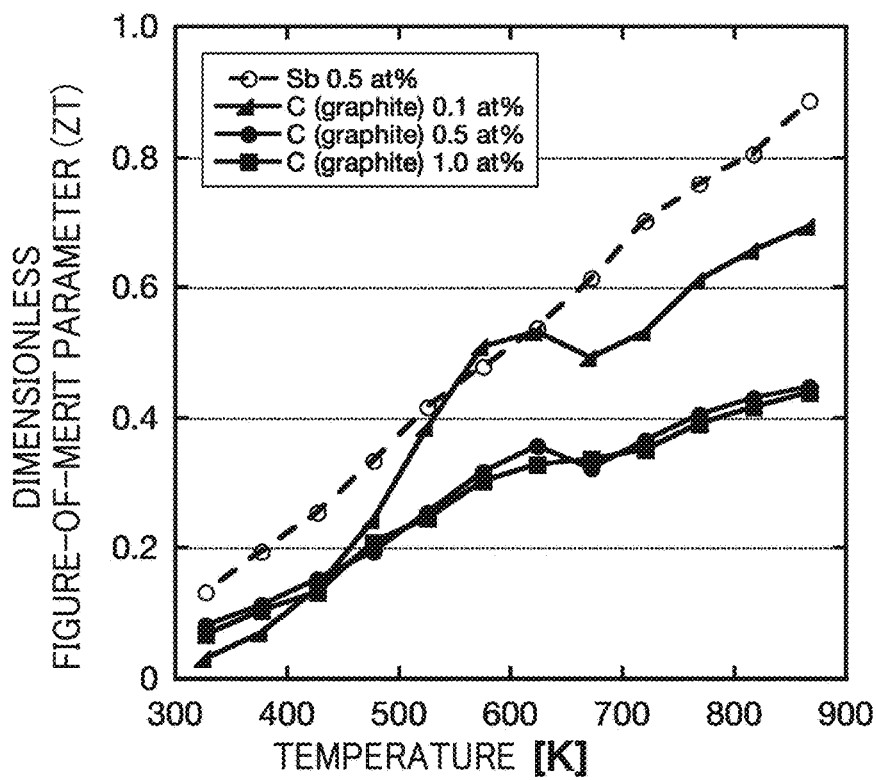
FIG. 22 is a graph showing a relation between a temperature and a dimensionless figure-of-merit parameter of the polycrystalline magnesium silicide sintered bodies in Comparative Examples 1 and 3 to 5.

In Comparative Examples 3 to 5, as shown in FIGS. 20 and 21, the power factor and the thermal conductivity largely fluctuated depending on the amount of graphite added. For this reason, it is considered that, in Comparative Examples 3 to 5, graphite does not function as isoelectronic impurities. Further, as shown in FIG. 21, the thermal conductivity increased according to an increase in the amount of graphite added, which was a different behavior from usual dopant addition. Furthermore, as shown in FIG. 22, ZT decreased according to an increase in the amount of graphite added, and in C (graphite)-added $Mg_2Si$ of Comparative Examples 3 to 5, thermoelectric performance enhancement at the same level as in Sb-added Mg$_2$Si of Comparative Example 1 was not observed.

Herein, the thermal conductivity of graphite is substantially 120 Wm$^{-1}$K$^{-1}$ and is about 16 times the thermal conductivity of Mg$_2$Si. From this point, in Comparative Examples 3 to 5, it is indicated that graphite is not dissolved, and a cause for an increase in thermal conductivity is speculated to be based on the fact that graphite is not dissolved.

High-Temperature Durability Test

The high-temperature durability of the sintered bodies of polycrystalline magnesium silicide in Examples 1 and 2 and Comparative Example 1 was evaluated by the following method.

A sample having a size of 2 mm length×2 mm width×8 mm height was cut from each sintered body, the surface, which has an area of 2 mm×2 mm, of the sample was treated by sand paper and then treated by an automatic polisher MA-150 (manufactured by Musashino Denshi) to remove an oxidized film on the surface.

Next, the surface from which the oxidized film is removed was used as a measurement surface, and the resistance of the sample was measured using BATTERY HiTESTER 3561 (manufactured by HIOKI E.E. CORPORATION). The electrical resistivity was measured by polishing the measurement surface and bringing a probe into contact with the surface. Further, since time degradation cannot be determined when the electrical resistivity varies depending on samples, the electrical resistivity of all the samples to be used was measured before the heat treatment, and the value was confirmed to be equal to a value before the sample was held in a tubular furnace. It should be noted that an interval between four probes brought into contact with the measurement surface was set to 1 mm. The current condition at the time of measurement was set up to 30 mA.

After the resistivity was calculated, the sample was put in a ring furnace maintained at 600° C. in the atmosphere. After a lapse of 10 hours, the sample was taken out from the ring furnace, the measurement surface was polished, and the resistivity in Examples 1 and 2 and Comparative Example 1 was derived by the same method as described above. Also after lapses of 50, 100, 200, 300, 400, and 500 hours, similarly, the resistivity in Examples 1 and 2 and Comparative Example 1 was derived. Further, regarding Examples 1 and 2, the resistivity after lapses of 1000, 1500, and 2000 hours was derived by the same method as described above according to the mathematical formula: length×width×resistance÷height. The resistivity evaluation results are shown in FIGS. 16 and 17.

Figure 16:
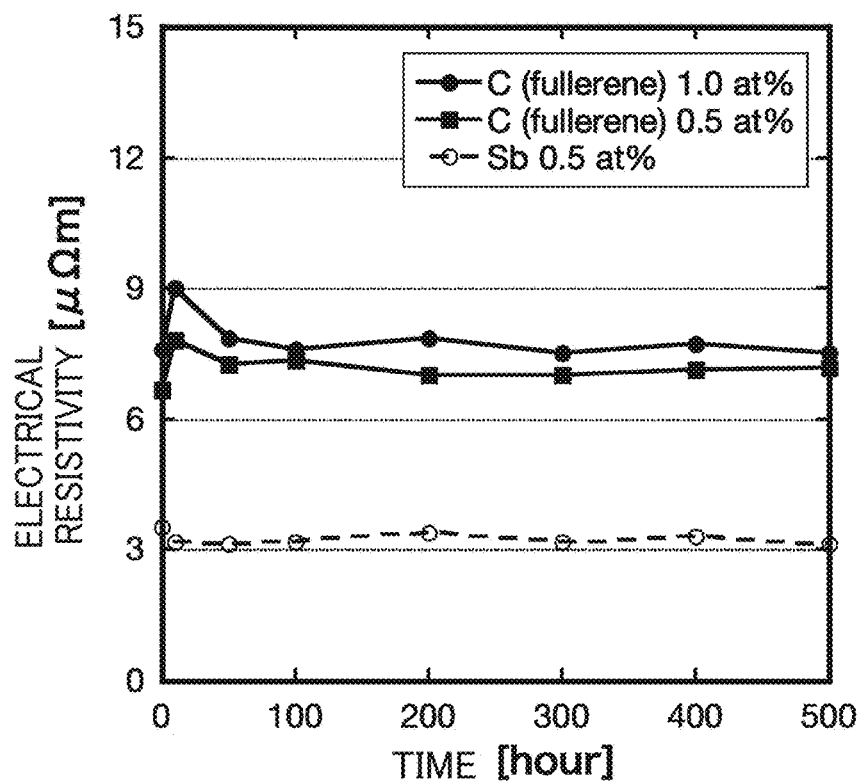
FIG. 16 is a graph showing a temporal change (0 hours to 500 hours) in electrical resistivity of the polycrystalline magnesium silicide sintered bodies in Examples 1 and 2 and Comparative Example 1.
Figure 17:
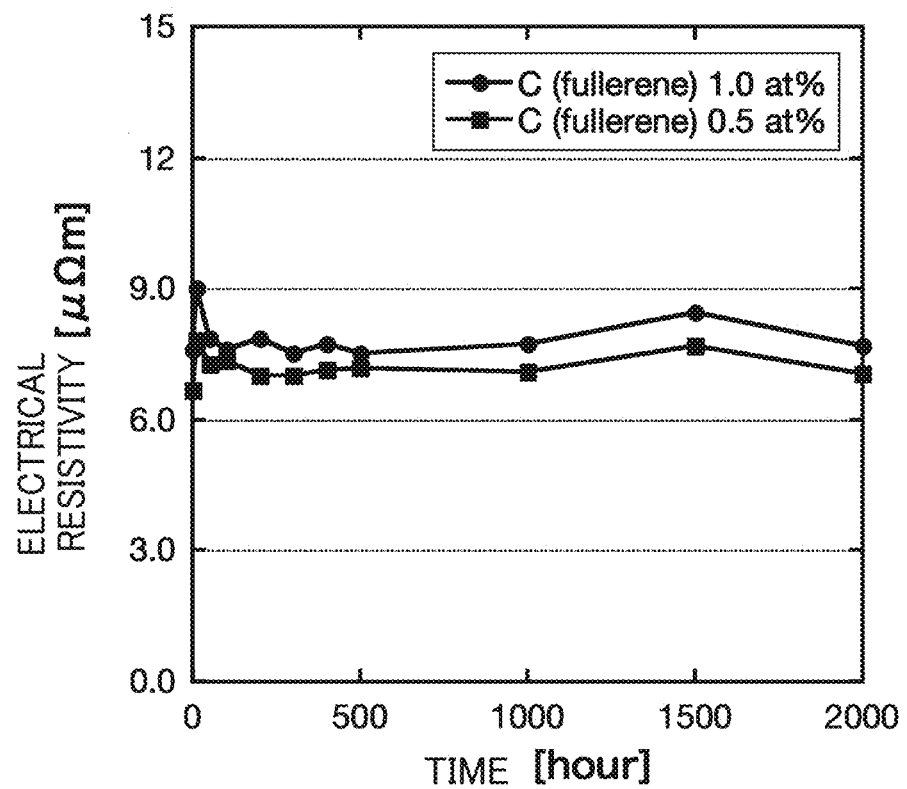
FIG. 17 is a graph showing a temporal change (0 hours to 2000 hours) in electrical resistivity of the polycrystalline magnesium silicide sintered bodies in Example 1 and Example 2.

It is known that the polycrystalline magnesium silicide sintered body added with antimony has excellent high-temperature durability, and as shown in FIG. 16, the polycrystalline magnesium silicide sintered body added with antimony maintains high-temperature durability until 500 hours similarly to the polycrystalline magnesium silicide sintered body added with carbon (fullerene), but high-temperature durability thereof gradually degrades at the time of longer than 500 hours. On the other hand, as shown in FIG. 17, it is clearly understood that, in the case of the polycrystalline magnesium silicide sintered body added with carbon (fullerene), high-temperature durability is maintained for at least 2000 hours.

Measurement of Current Value and Voltage Value at Maximum Output

Next, comparison between a current value and a voltage value at the time of the maximum output of the polycrystalline magnesium silicide sintered bodies in Example 1, Example 2, and Comparative Example 1 was performed. First, each sintered body was cut to a size of 4 mm×4 mm×6 mm to be used as a thermoelectric conversion part, and elements for measuring a short-circuit current and an open voltage provided with a first electrode (Ni electrode), a thermoelectric conversion part, and a second electrode (Ni electrode) were produced by pressurized compression sintering (first method) described above. The short-circuit current and the open voltage of each element were measured by a real electromotive force measurement apparatus KTE-HTA-600C (manufactured by Kotohira Kogyo Co., Ltd.).

Figure 18:
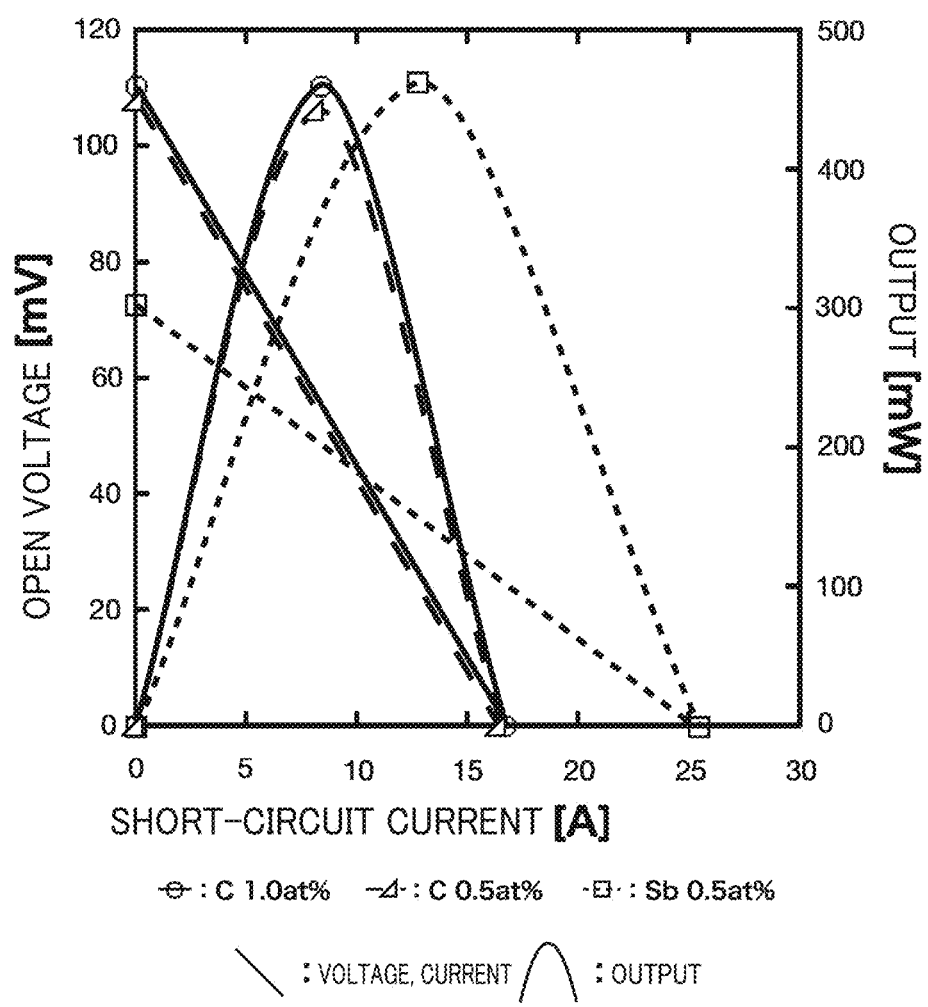
FIG. 18 is a graph showing a relation among current, voltage, and output of the polycrystalline magnesium silicide sintered bodies in Examples 1 and 2 and Comparative Example 1.

In the measurement, a real electromotive force measurement apparatus (manufactured by Kotohira Kogyo Co., Ltd., KTE-HTA-600c) was used as a measurement system. A Cu plate for temperature control (4 mm thickness, oxygen-free copper+Ni plating) simulated as a heat source and a cooling source, a T-shaped Cu block (4 mm thickness), which can be connected to a thermocouple and a terminal for electrical measurement, a Mg$_2$Si element, and an isowool heat insulating material were used in a sink section. Whity Seven (boron nitride (BN)-based heat-resistant ceramic coating agent, manufactured by Audec Co., Ltd.) was filled in an interface between the Cu plate at the heat source side and the high-temperature T-shaped Cu block, and a silicone compound (manufactured by Shin-Etsu Chemical Co., Ltd., G747) was used as a thermal interface material for an interface between the Cu plate at the cooling source side and the low-temperature T-shaped block, so that the contact thermal resistance is decreased and a difference in temperature due to a stable and pure element shape can be measured. A conductive silver paste (4817N, butyl acetate 20% to 30%, manufactured by DuPont) was used between the element and the T-shaped Cu block such that the contact electrical resistance at the interface is not included. It should be noted that a four-terminal method was used for each use of the T-shaped block. An open voltage (current: 0 A) was measured by the above-described measurement system, a load current was measured every 1 A until 5 A, and the extrapolation line of I-V characteristics was drawn to calculate a short-circuit current (voltage: 0 V). From those results, relations among current, voltage, and output (current×voltage) of the polycrystalline magnesium silicide sintered bodies in Example 1, Example 2, and Comparative Example 1 were obtained. The results are shown in FIG. 18.

It is found that the C (fullerene) 0.5 at %-added Mg$_2$Si in Example 1 has the maximum output at a current of 8.200 A and a voltage of 54.211 mV and the output thereof is 443.47 mW, and the C (fullerene) 1.0 at %-added Mg$_2$Si in Example 2 has the maximum output at a current of 8.320 A and a voltage of 55.211 mV and the output thereof is 459.36 mW, so that both are a voltage output type (high voltage and low current). On the other hand, it is found that the antimony 0.5 at %-added polycrystalline magnesium silicide of Comparative Example 1 has the maximum output at a current of 12.724 A and a voltage of 36.398 mV and the output thereof is 463.12 mW, so that the polycrystalline magnesium silicide is a current output type (high current and low voltage).

Comparison of Power Loss and Number of Elements

In the elements in Example 1, Example 2, and Comparative Example 1, the maximum output at almost the same degree is obtained, and in a case where it is assumed that there is no loss, in order to obtain an output of about 5 W (5000 [mW]) in all elements, about 11 elements as described below are necessary.
Example 1: 5000 [mW]÷443.47 [mW]=11.275≈11
Example 2: 5000 [mW]÷459.36 [mW]=10.885≈11
Comparative Example 1: 5000 [mW]÷463.12 [mW] =10.796≈11

However, actually, it is difficult to consider that there is no loss, and it is assumed that loss is generated by resistance between the thermoelectric conversion element and a DC/DC converter or the like. Hereinafter, a loss (mW) generated in each thermoelectric conversion element and the number of elements actually necessary for obtaining an output of about 5 W were calculated.

Resistance values of the elements in Example 1, Example 2, and Comparative Example 1 are assumed to be identical to each other, and the value thereof is set to 1 mΩ. When the loss is calculated on the basis of the mathematical formula of the product of the resistance value and the square of the current value, the result as described below is obtained, and when the loss in one element is compared to the case of Comparative Example 1, the loss in the case of Example 1 is decreased to be 94.660 mW and the loss in the case of Example 2 is decreased to be 92.678 mW.
Example 1: 1 mΩ×(8.200 A)²=67.240 mW
Example 2: 1 mΩ×(8.320 A)²=69.222 mW
Comparative Example 1: 1 mΩ×(12.724 A)²=161.90 mW As described above, regarding the output in one element when the loss is considered, the outputs in the elements in Example 1 and Example 2 are 376.235 mW and 390.138 mW, respectively, and the output in the element in Comparative Example 1 is 301.22 mW. In order to actually obtain an output of about 5 W (5000 [mW]), as described below, the number of necessary elements is about 13 in Example 1 and Example 2, about 17 in Comparative Example 1, and in the case of Comparative Example 1, the number of necessary elements is larger by four.
Example 1: 5000 [mW]÷376.235 [mW]=13.290≈13
Example 2: 5000 [mW]÷390.138 [mW]=12.816≈13
Comparative Example 1: 5000 [mW]÷301.22 [mW] =16.599≈17

As described above, since the loss is expressed as the product of the square of the current value and the resistance value, dependence of the current value on the loss is large. For this reason, in the case of the voltage output type as in Example 1 and Example 2, since the voltage value does not contribute to the loss, the loss is small and thus the number of necessary elements is decreased, but in the case of the current output type as in Comparative Example 1, the loss increases and thus the number of necessary elements is increased. As described above, as compared to the current output type, when the number of elements is decreased by four in the case of 5 W, if it is considered that usual power is larger than 5 W, the effect of decreasing the number of elements by the voltage output type is extremely large at the time of a module being put to practical use. Further, in Example 1 and Example 2, since the same output is obtained by decreasing the number of elements at the time of modularization as compared to Comparative Example 1, risk or the like that the element is broken can also be alleviated.

In the case of an actual module using the polycrystalline magnesium silicide, the resistance value is larger than 1 mΩ, and when resistance with a DC/DC converter or the like is considered, the loss is further increased, so that it is considered that the number of elements in Example 2 that is the voltage output type can be further decreased than that in Comparative Example 1 that is the current output type.

Electrode Durability Test

A thermoelectric conversion part and a thermoelectric conversion element having Ni electrodes provided at both end parts were produced for an electrode durability test. The pulverized material of polycrystalline magnesium silicide produced in each of Example 1, Example 2, and Comparative Example 1 was used for the thermoelectric conversion part, Ni powder was used for the electrode part, those materials were sintered by pressurized compression sintering (first method) described above, and five thermoelectric conversion elements having a size of 2 mm length, 2 mm width, and 10 mm height (of these, the total of the electrode parts at both end parts being 2 mm) were cut from each of three types of the obtained sintered bodies, thereby producing samples. These samples were put in a ring furnace held at 600° C., similarly to that used in the aforementioned high-temperature durability test, and were observed every 10 hours. As a result, in all the samples doped with antimony of Comparative Example 1, the electrodes were peeled off after a lapse of 30 hours and the electrode parts were in a collapsed state at 100 hours. On the other hand, regarding all the samples using fullerene of Example 1 and Example 2, peeling of the electrodes did not occur at all even after a lapse of 300 hours and the electrode parts were not in a collapsed state. This test result is considered as follows: carbon distributed within crystal grains of the polycrystalline magnesium silicide of present disclosure exhibits the action of enhancing adhesion and binding property with the electrode parts in a case where the polycrystalline magnesium silicide is used as the thermoelectric conversion part, and thereby, a sintered body having a relative density of 98% or more is obtained, so that the sintered body does not change at all even in an atmosphere of 600° C. for 300 hours.

The disclosure of Japanese Patent Application No. 2016-137976 filed on Jul. 12, 2016 is incorporated herein by reference in its entirety.

EXPLANATION OF REFERENCE NUMERALS

101 n-type thermoelectric conversion part
1015, 1016 electrode
102 p-type thermoelectric conversion part
1025, 1026 electrode
103 n-type thermoelectric conversion part
1035, 1036 electrode
3 load
4 DC power source
10 graphite die
11a, 11b punch made of graphite

The invention claimed is:

1. Polycrystalline magnesium silicide comprising an isoelectronic impurity of silicon as a dopant, wherein the isoelectronic impurity consists of carbon atoms, wherein the carbon atoms are distributed within crystal grains and at crystal grain boundaries of the polycrystalline magnesium silicide, and wherein the carbon atoms that replace a portion of the silicon atoms within the crystal grains of the polycrystalline magnesium silicide function as the dopant.

2. The polycrystalline magnesium silicide according to claim 1, wherein the polycrystalline magnesium silicide contains 0.05 at % to 3.0 at % of carbon in an atomic weight ratio.

3. A thermoelectric conversion material comprising the polycrystalline magnesium silicide according to claim 1.

4. A method for producing polycrystalline magnesium silicide, the method comprising heating and melting a starting material composition containing magnesium, silicon, and a carbon source in a reducing atmosphere at a temperature of 1085° C. or higher and lower than 1410° C. to produce a melted and solidified material, wherein during the heating and melting, carbon generated by thermal decomposition of the carbon source is distributed within crystal grains and at crystal grain boundaries of the polycrystalline magnesium silicide.

5. The method according to claim 4, wherein the carbon source is fullerene.

6. The method according to claim 4, further comprising pulverizing the melted and solidified material to produce a pulverized material.

7. A method for producing a sintered body, the method comprising sintering a pulverized material obtained by the method according to claim 6 using a spark plasma sintering method in an inert gas atmosphere under conditions of sintering temperature of 600° C. to 1,000° C. and sintering pressure of 5 MPa to 60 MPa.

8. The polycrystalline magnesium silicide according to claim 1, wherein the polycrystalline magnesium silicide is a melted and solidified material of a starting material composition obtained by mixing magnesium, silicon and fullerene and the carbon distributed within crystal grains and at crystal grain boundaries is derived from the fullerene.

9. The thermoelectric conversion material according to claim 3, wherein the thermoelectric conversion material comprises no unreacted magnesium.

10. A sintered body obtained by sintering the polycrystalline magnesium silicide according to claim 1.

11. The sintered body according to claim 10, wherein the sintered body has a relative density of 98% or more.

12. A thermoelectric conversion material configured by the sintered body according to claim 10.

13. The thermoelectric conversion material according to claim 12, wherein the thermoelectric conversion material comprises no unreacted magnesium.

14. A thermoelectric conversion element, comprising the thermoelectric conversion part configured by the thermoelectric conversion material according to claim 3; and a first electrode and a second electrode provided to the thermoelectric conversion part.

15. A thermoelectric conversion module, comprising the thermoelectric conversion element according to claim 14.

16. A thermoelectric conversion element, comprising the thermoelectric conversion part configured by the thermoelectric conversion material according to claim 12; and a first electrode and a second electrode provided to the thermoelectric conversion part.

17. A thermoelectric conversion module, comprising the thermoelectric conversion element according to claim 16.

18. The method for producing a polycrystalline magnesium silicide according claim 4, wherein a ratio of the carbon source in the starting material composition is 0.05 at % to 3.0 at % in an atomic weight ratio.

* * * * *

UNITED STATES PATENT AND TRADEMARK OFFICE
CERTIFICATE OF CORRECTION

PATENT NO. : 11,114,600 B2
APPLICATION NO. : 16/314841
DATED : September 7, 2021
INVENTOR(S) : Iida et al.

It is certified that error appears in the above-identified patent and that said Letters Patent is hereby corrected as shown below:

In the Specification

In Column 1, Line 7, delete "WO 2018/112369" and insert --WO 2018/012369--.

In Column 3, Line 3, delete "x" and insert --κ--.

In Column 7, Line 17, delete "matetial." and insert --material.--.

In Column 9, Line 45, delete "high temperature" and insert --high-temperature--.

In Column 14, Line 34 (Approx.), delete "$Wm^{-2}$" and insert --$Wm^{-1}K^{-2}$--.

In Column 19, Line 61, delete "Togyo" and insert --Kogyo--.

In the Claims

In Column 32, Line 25, Claim 18, delete "according claim" and insert --according to claim--.

Signed and Sealed this
Eighth Day of March, 2022

Drew Hirshfeld
*Performing the Functions and Duties of the
Under Secretary of Commerce for Intellectual Property and
Director of the United States Patent and Trademark Office*